(12) United States Patent
Doan et al.

(10) Patent No.: US 11,817,536 B2
(45) Date of Patent: *Nov. 14, 2023

(54) METHOD FOR MAKING ELECTRONIC DEVICE ARRAYS USING A TEMPORARY SUBSTRATE AND A CARRIER SUBSTRATE

(71) Applicant: SemiLEDs Optoelectronics Co., Ltd, Chu-nan (TW)

(72) Inventors: David Trung Doan, Baoshan Township, Hsinchu County (TW); Trung Tri Doan, Baoshan Township, Hsinchu County (TW)

(73) Assignee: SemiLEDs Optoelectronics Co., Ltd., Chu-nan (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/676,334

(22) Filed: Feb. 21, 2022

(65) Prior Publication Data

US 2022/0278261 A1 Sep. 1, 2022

Related U.S. Application Data

(63) Continuation of application No. 17/078,323, filed on Oct. 23, 2020, now Pat. No. 11,387,397, and a
(Continued)

(51) Int. Cl.
*H01L 33/62* (2010.01)
*H01L 25/16* (2023.01)
(Continued)

(52) U.S. Cl.
CPC .......... *H01L 33/62* (2013.01); *H01L 25/0753* (2013.01); *H01L 25/167* (2013.01);
(Continued)

(58) Field of Classification Search
CPC ..... H01L 33/62; H01L 33/0093; H01L 33/52; H01L 33/0095; H01L 25/0753; H01L 25/167
(Continued)

(56) References Cited

U.S. PATENT DOCUMENTS

| 8,410,487 B1 | 4/2013 | Cheng et al. |
| 10,910,535 B2 | 2/2021 | Doan et al. |

(Continued)

OTHER PUBLICATIONS

U.S. Appl. No. 16/139,292, "Method for Making Light Emitting Device LED Arrays", filed Sep. 24, 2018, Non-Final Office Action dated Oct. 29, 2019, pp. 1-15.
(Continued)

*Primary Examiner* — Igwe U Anya
(74) *Attorney, Agent, or Firm* — Stephen A. Gratton

(57) ABSTRACT

A method for making light emitting device LED arrays includes the steps of providing a plurality of LEDs having a desired configuration (e.g., VLED, FCLED, PLED); attaching the LEDs to a carrier substrate and to a temporary substrate; forming one or more metal layers and one or more insulator layers configured to electrically connect the LEDs to form a desired circuitry; and separating the LEDs along with the layered metal layers and insulator layers that form the desired circuitry from the carrier substrate and the temporary substrate.

16 Claims, 36 Drawing Sheets

Related U.S. Application Data continuation of application No. 16/139,292, filed on Sep. 24, 2018, now Pat. No. 10,910,535.

(51) Int. Cl.
  *H01L 33/52* (2010.01)
  *H01L 25/075* (2006.01)
  *H01L 33/00* (2010.01)

(52) U.S. Cl.
  CPC .......... *H01L 33/0093* (2020.05); *H01L 33/52* (2013.01); *H01L 33/0095* (2013.01); *H01L 2933/005* (2013.01); *H01L 2933/0066* (2013.01)

(58) Field of Classification Search
  USPC .......................................................... 257/89
  See application file for complete search history.

(56) References Cited

U.S. PATENT DOCUMENTS

| | | | |
|---|---|---|---|
| 11,387,397 B2* | 7/2022 | Doan | H01L 25/167 |
| 2008/0046080 A1* | 2/2008 | Vanden Bulcke | A61N 1/0541 |
| | | | 257/692 |
| 2009/0179207 A1 | 7/2009 | Chitnis et al. | |
| 2012/0034437 A1 | 2/2012 | Puligadda et al. | |
| 2015/0008389 A1 | 1/2015 | Hu | |
| 2015/0179876 A1 | 6/2015 | Hu | |
| 2015/0179884 A1 | 6/2015 | Kang et al. | |
| 2016/0043061 A1 | 2/2016 | Rhee | |
| 2017/0033026 A1* | 2/2017 | Ho | H01L 23/49827 |
| 2017/0345801 A1 | 11/2017 | Lin | |
| 2018/0007750 A1 | 1/2018 | Meitl | |
| 2018/0233536 A1 | 8/2018 | Chang | |
| 2019/0165231 A1 | 5/2019 | Doan et al. | |
| 2021/0043820 A1 | 2/2021 | Doan et al. | |

OTHER PUBLICATIONS

U.S. Appl. No. 16/139,292, "Method for Making Light Emitting Device LED Arrays", filed Sep. 24, 2018, Final Office Action dated Jun. 23, 2020, pp. 1-14.

U.S. Appl. No. 16/139,292, "Method for Making Light Emitting Device LED Arrays", filed Sep. 24, 2018, Notice of Allowance dated Sep. 28, 2020, pp. 1-8.

U.S. Appl. No. 17/078,323, "Method for Making Light Emitting Device (LED) Arrays Using a Temporary Substrate and a Carrier Substrate" filed Oct. 23, 2020, Non-Final Office Action dated Oct. 1, 2021, pp. 1-10.

* cited by examiner

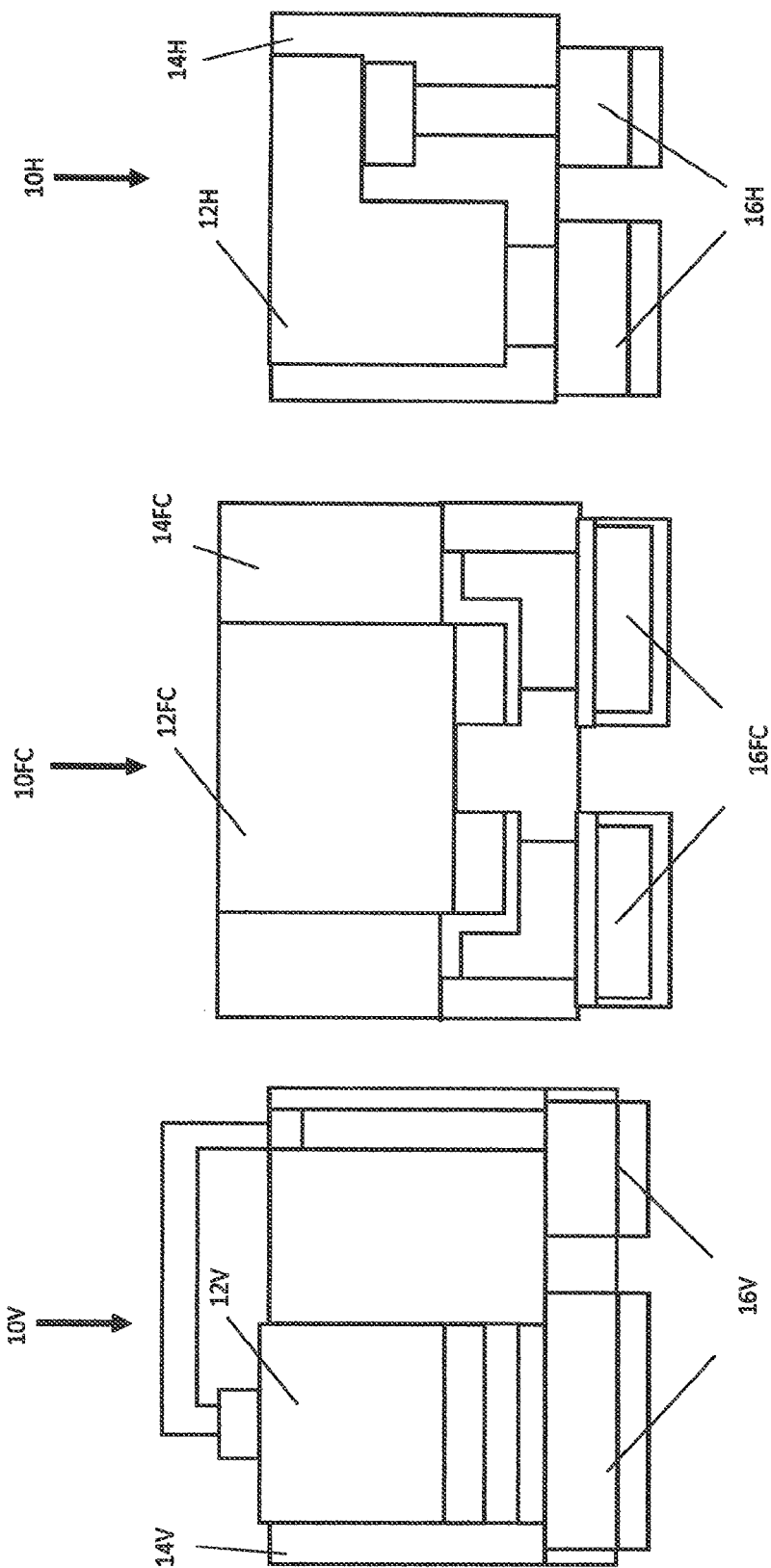

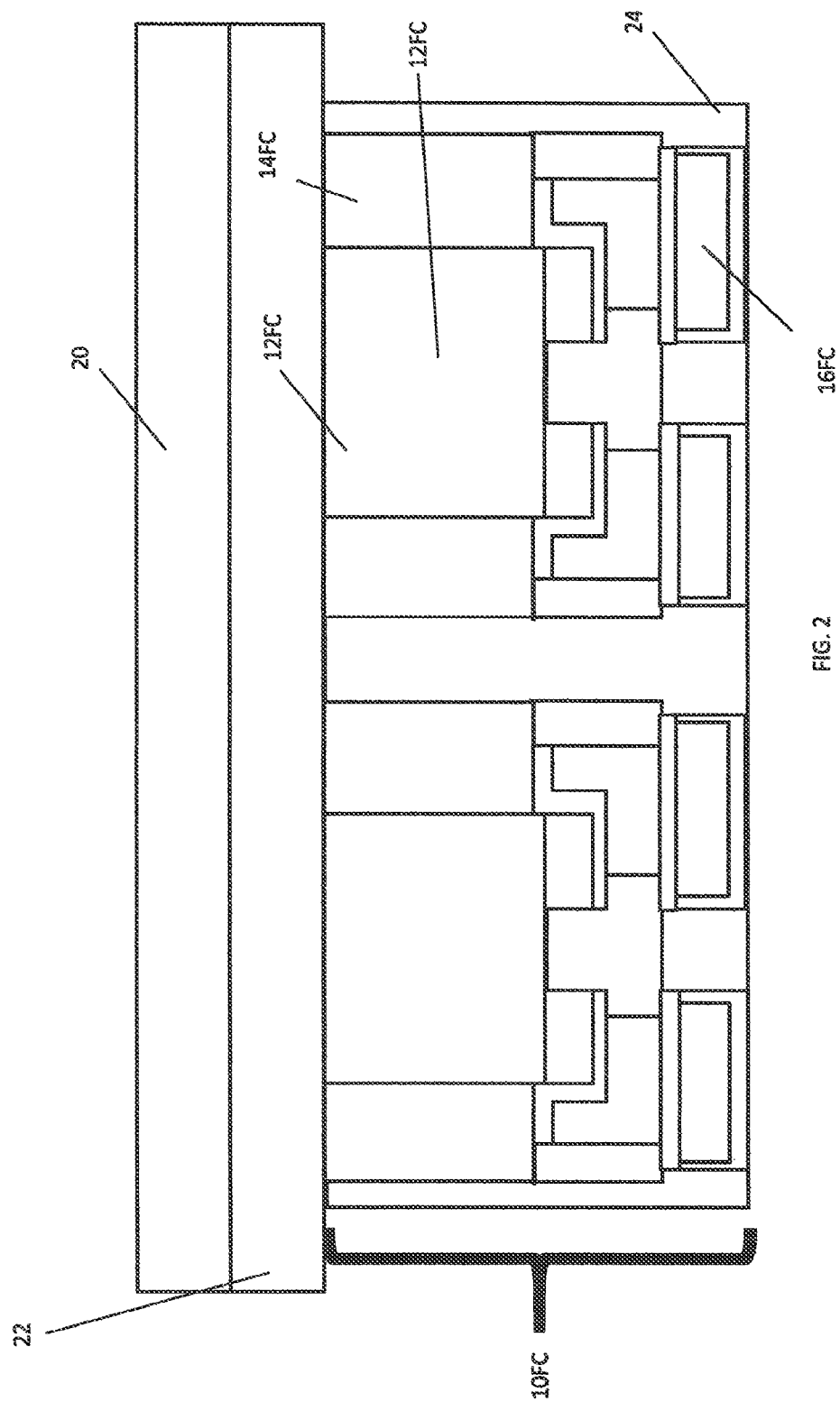

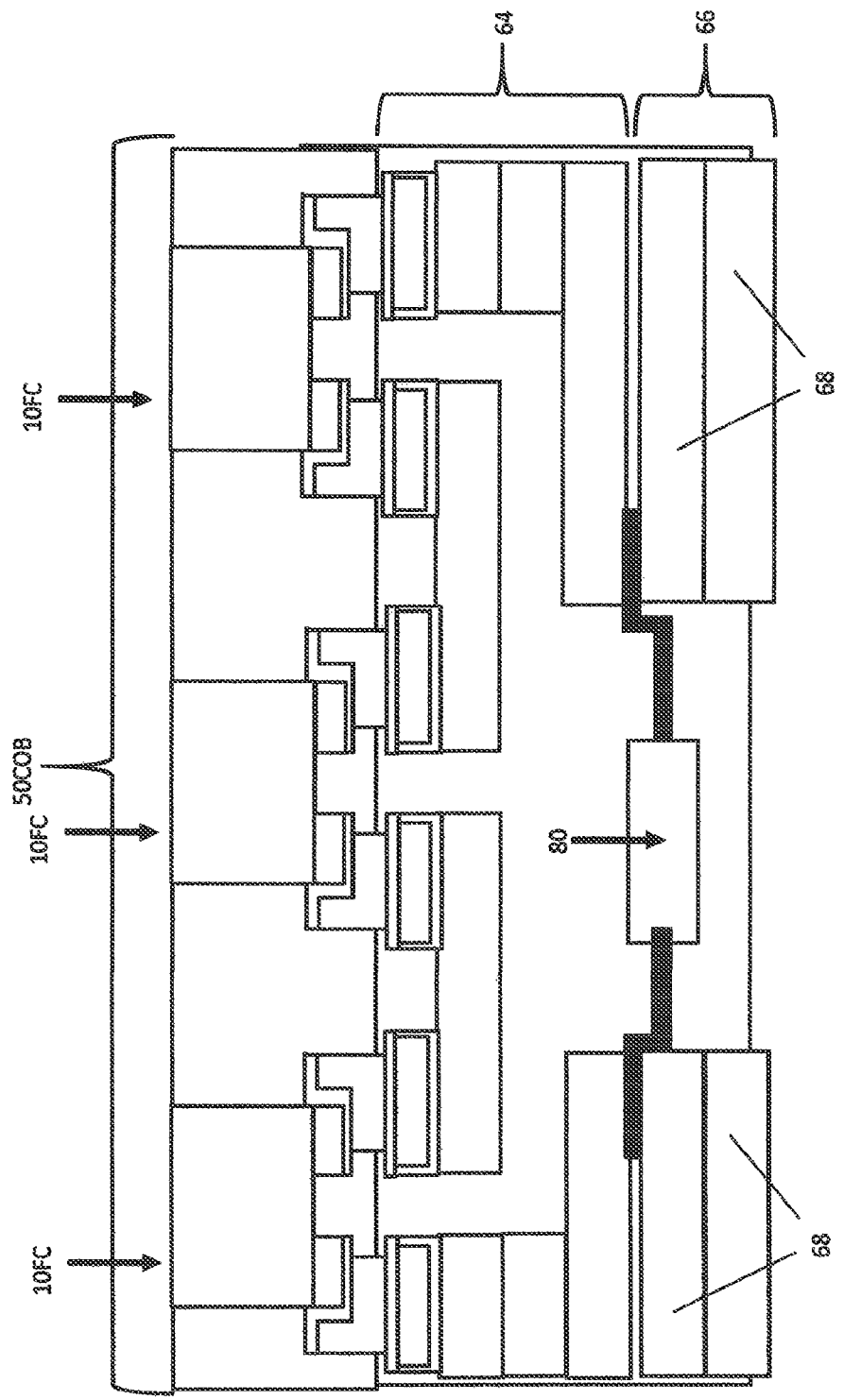

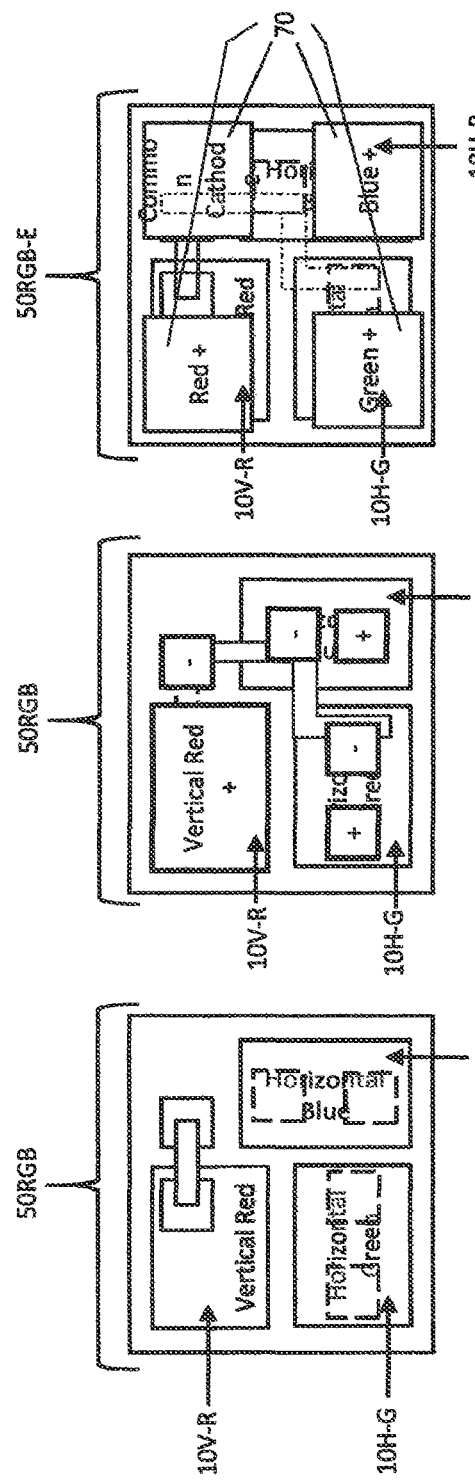

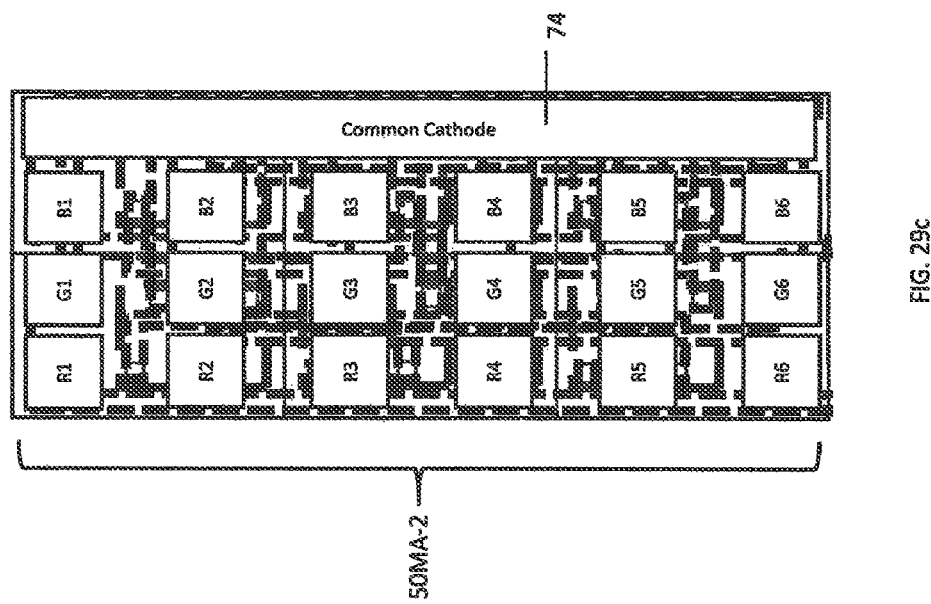

METHOD FOR MAKING ELECTRONIC DEVICE ARRAYS USING A TEMPORARY SUBSTRATE AND A CARRIER SUBSTRATE

CROSS REFERENCE TO RELATED APPLICATIONS

This application is a continuation of U.S. application Ser. No. 17/078,323, filed Oct. 23, 2020, U.S. Pat. No. 11,387,397 B2, which is a continuation of U.S. application Ser. No. 16/139,292, filed Sep. 24, 2018, U.S. Pat. No. 10,910,535 B2, which claims priority to U.S. Provisional Application No. 62/583,018 filed Nov. 8, 2017, and to U.S. Provisional Application No. 62/590,715 filed Nov. 27, 2017.

FIELD

This disclosure relates to a method for making optical devices such as light emitting devices LED into arrays using chip scale level. This disclosure also relates to light emitting device LED arrays made using the method.

BACKGROUND

There are various types of optical devices, such as optical sensors, optical emitters such as laser diode and light emitting devices LEDs. For light emitting devices LEDs, there are also many variations. However, all LED devices have a P side surface and an N side surface with multiple quantum well (MQW) layers sandwiched therebetween. LED devices include vertical light emitting devices VLED, which have metal electrodes on the opposing sides of the device (one on the P side and one on the N-side"). LED devices also include planar light emitting devices PLED, such as flip-chip FCLED or conventional horizontal HLE. Both FCLED and HLED have both anode and cathode metal electrodes located on one side of the LED device (either the P side or N side). Light emitting diode LED devices can be packaged to form packaged LED having one or more LED chip. Recently, chip scale packages CSPs have also become available.

To make an LED array, multiple LEDs can be packaged and surface mounted using surface mounting technology SMT to a printed circuit board PCB, or to a ceramic circuit board CCB to form an array of LEDs. Bare LED dice can also be used to make LED arrays by die attachment to the PCB or CCB with wire bonding of one or more electrodes to the PCB to complete the electrical connections to the PCB. However, mixing different types of light emitting devices LEDs, such as vertical light emitting devices having metal electrodes on both sides of the device, and planar light emitting devices PLEDs, such as flip-chip LEDs or conventional LEDs (CSP or conventional package) can be difficult. In particular, both types of LEDs (VLEDs, PLEDs) have metal electrodes located on one side of the LED device, requiring separate bonding strategies for the different types of LEDs. For example, different techniques are sometimes needed, such as surface mount (SMT), die attach, wire bonding, soldering, or some permutation of these methods. Furthermore, each individual package or LED has to be attached individually to the bond pads on the PCB or CCB. Still further, the number of metal pads on the PCB or CCB needs to be the same as the number of metal electrodes required to attached each LED or LED package to the PCB.

For example, to make a 10 by 10 RGB (red/green/blue) pixel LED array, each pixel requires one red LED, one green LED, and one blue LED. If PLEDs are used, this requires 100×100×3 LEDs (RGB)×2 pads for each, which equals 60,000 good die attach bonds for a 100×100 color pixel array. If only one bond is bad, the array would not be useable. If VLEDs are used, this requires 100×100×3 LEDs (RGB)×1 pad for each), which equals 30,000 good die attach bonds for a 100×100 color pixel array. Because 30,000 good wire bonds are required to electrically connect the second electrodes to the PCB, if any one of these electrical connections is bad the array would be un-useable. The die attach and wire bonding processes are very intensive due to the need to handle each LED, and then bond them to the PCB. In addition, the PCB and CCB fabrication processes are very costly, as many small metal lines and via holes must be formed using laser drilling.

The present disclosure is directed to a method for making LED arrays that overcomes some of the problems associated with prior art methods, particularly where different types of LED dice or LED packages are required. In particular, the present disclosure teaches a method for making LED arrays without the need to attach the LEDs or packaged LEDs to the PCB or CCB by die attach or SMT. In addition, the present disclosure teaches a method for making LED arrays wherein some metal interconnecting layer (or layers) are fabricated by directly depositing and patterning metals using various processes. In some applications, this can eliminate the need for a PCB or CCB. In addition, if a PCB or CCB is required, the complexity of the PCB or CCB can be reduced, as the array can be surface mounted or bonded to a less complex PCB or CCB. This method also reduces the number of layers, as well as allowing the use of larger critical dimensions of line and space, and the number of via holes needed for a PCB or CCB.

SUMMARY

A method for making light emitting device LED arrays includes the step of providing a plurality of LEDs, such as LED dice or LED packages having a desired configuration. For example, LED dice can comprise VLEDs or PLEDs dice. As another example, LED packages can comprise LED chip scale packages CSPs, leadframe LED packages, ceramic LED packages and other types of LED packages as well. The CSPs can comprise VLED CSPs, FCLED CSPs, HLED CSPs or planar PLED CSPs. As another alternative, the LEDs can comprise optical devices, such as laser diode, optical receiver suitable for making the LED arrays.

The method also includes the step of attaching the LEDs to a carrier substrate and to a temporary substrate. The carrier substrate functions as a support substrate and the temporary substrate functions as an attaching substrate. In addition, the support substrate and the temporary substrate can be combined into one substrate. The method also includes the step of forming one or more metal layers that will electrically connect the LEDs to form a desired circuitry. The method also includes the step of forming one or more insulator layers for electrically isolating the metal layers and in the case of bare LED dice for encapsulation purposes. Forming of the metal layers and the insulator layers can be performed in stages such that the completed LED arrays have a layered configurations with a desired number of layers. Depending on the configuration of the LEDs, further circuitry elements such as electrical connectors and wire bonds can also be formed. In addition, circuitry components can be mounted in chip on board (COB) configuration for forming the circuitry.

The method also includes the step of separating the LEDs along with the layered metal layers and insulator layers that form the desired circuitry from the carrier substrate and the temporary substrate. In an alternate embodiment of the method metal posts, in addition to or in place of the metal layers, can be formed, insulated, and then electrically connected to interconnect the LEDs to form the desired circuitry. The method can also include the step of combining multiple arrays using an interconnection system that can include a common cathode. In one embodiment of the invention, the LED array can be made without the use of a PCB or a CCB. In this embodiment the LEDs of the LED array can be connected using metal interconnects directly connected to electrodes.

BRIEF DESCRIPTION OF THE DRAWINGS

Exemplary embodiments are illustrated in the referenced figures of the drawings. It is intended that the embodiments and the figures disclosed herein be considered illustrative rather than limiting.

FIG. 1 is a schematic cross sectional view illustrating various packaged LED suitable for performing a method for making light emitting device LED arrays;

FIG. 2 is a schematic cross-sectional view illustrating a step of attaching chip scale packages CSP to a carrier substrate and to a temporary substrate in the method;

FIG. 26 is a schematic cross sectional view illustrating a COB LED array constructed using the method with chip on board COB circuitry;

FIG. 27(a) is a schematic plan view of a RGB array constructed using the method;

FIG. 27(b) is a schematic bottom view of the RGB array;

FIG. 27(c) is a schematic bottom view of the RGB array with extended pads;

FIG. 29(c) is a schematic bottom view of the multiple array RGB array with a common cathode.

DETAILED DESCRIPTION

Figure 3A:
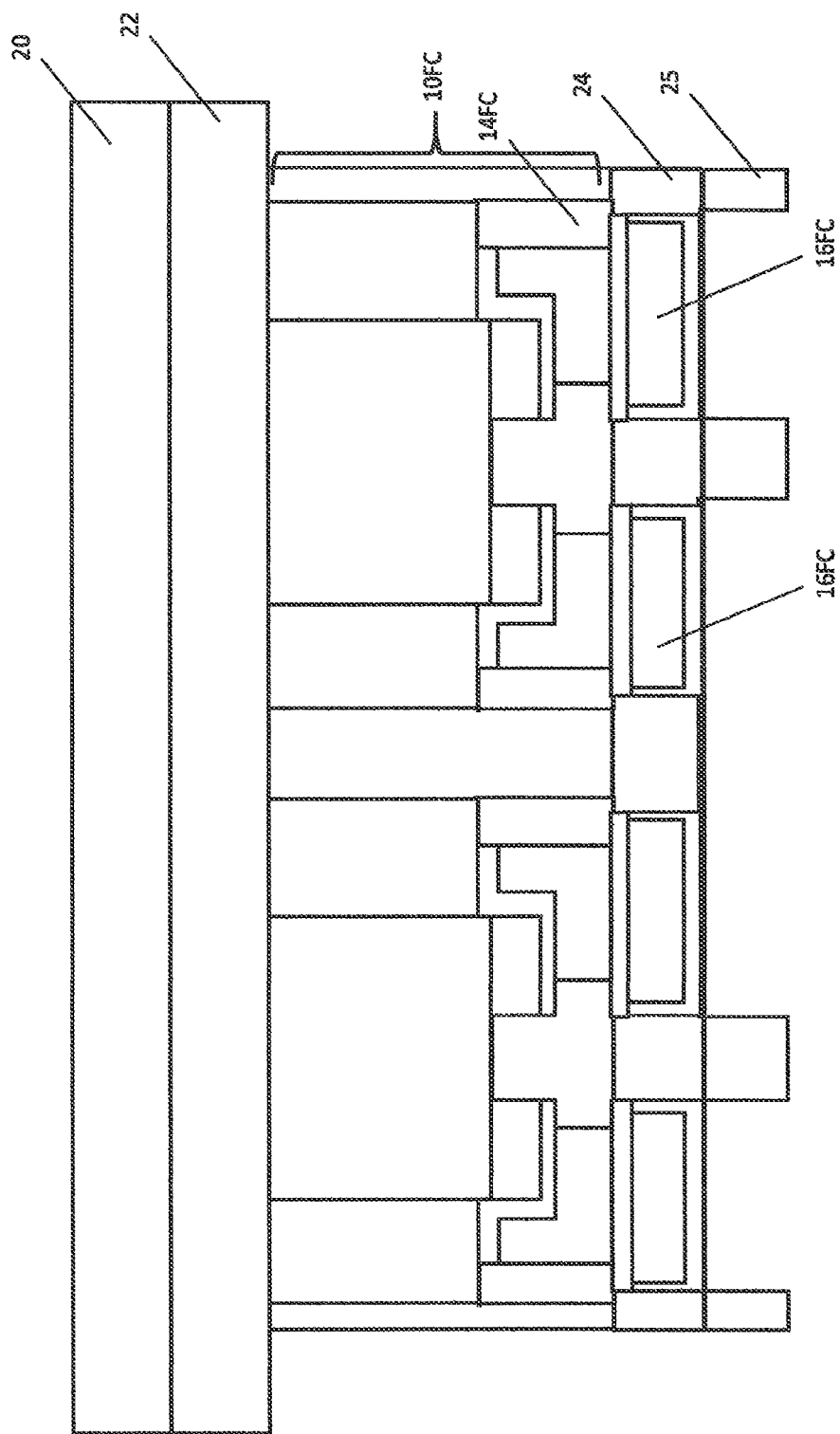
FIG. 3(a) is a schematic cross sectional view illustrating a step of forming an insulating layer in the method.

As used herein, the term light emitting device LED means an electronic device that includes a light emitting diode LED die, a packaged LED or an optical device such as a laser diode or an optical receiver. The term light emitting device LED array means an assembly of two or more light emitting devices LEDs.

FIG. 1 is a schematic cross sectional view illustrating various packaged LED (VLED CSP, FCLED CSP, HLED CSP) for performing a method for making light emitting device LED array. The method can use either vertical devices, flip chip devices or planar devices, as well as combinations of these devices packaged or chip form.

On the left of FIG. 1, a vertical CSP 10V includes an LED die 12V encapsulated by an insulator 14V and having extended pads 16V, which function as terminal contacts for the LED die 12V. Each pad 16V can be either an anode or a cathode. As such, the pads 16V can be interchangeable as long as a cathode and an anode are both present (meaning that individual polarity of the pads are not important for this disclosure other than to realize that one of them is a cathode and one of them is an anode). In the center of FIG. 1, a FCLED CSP 10FC includes an LED die 12FC encapsulated by an insulator 14FC and having extended pads 16FC. As before, each pad 16FC can be either an anode or a cathode as previously described. On the right of FIG. 1, a planar LED CSP 10H includes a LED die 12H encapsulated by an insulator 14H and having extended pads 16H. Again, each pad 16H can be either an anode or a cathode as previously described.

Further details of the VLED CSP 10V, the FCLED CSP 10FC and the PLED CSP 10H are disclosed in U.S. Provisional Application No. 62/583,018 filed Nov. 8, 2017, and U.S. Provisional Application No. 62/590,715 filed Nov. 27, 2017, both of which are incorporated herein by reference. However, it is to be understood that the method can be employed with other types of packages used in the LED industry as well as with bare LED dice and optical devices.

As shown in FIG. 2, the method can also include the step of attaching n number of the LEDs to a carrier substrate 20 and to a temporary substrate 22. In the illustrative embodiment, the LEDs comprise FCLED CSPs 10FC (FIG. 1), as previously described. However, the method can be practiced with other types of LED dice packaged LEDs, or optical devices. The carrier substrate 20 functions as a carrier system to provide physical support. Suitable materials for the carrier substrate 20 include sapphire, glass, AlN, Al oxide, or Kapton. The temporary substrate 22 functions as an adhesive layer and can comprise thermal tape, uv sensitive tape, dry film, or various adhesive systems. The temporary substrate 22 can be attached to the carrier substrate 20 using a suitable process such as a lamination process using heat, pressure and adhesives if necessary. The FCLED CSPs 10FC can then be attached to the temporary substrate 22 using a mechanical process such as a pick and place process. Depending on the material for the temporary substrate 22, a curing step can also be performed to cure the temporary substrate 22. In addition, a spray-on adhesive can be used to make the carrier substrate 20 both a carrier substrate and a temporary substrate.

After attaching the LEDs to the carrier substrate 20, the method can also include the step of forming an insulating layer 24 configured to electrically isolate each extended pad 16FC of the FCLED CSPs 10FC. In addition, the insulating layer 24 functions to connect the LEDs together and provides mechanical integrity of the array after the removal of the array from the temporary substrate 22 and the carrier substrate 20. The insulating layer 24 can be made of the same material as the insulator 14FC used to encapsulate the LED dice 12FC. Suitable materials for the insulating layer 24 and the insulator 14FC include silicone, epoxies, plastics and dry films deposited using a process such as screen printing, 3D printing, molding, or any other method that can place the insulating material. If needed the insulating layer 24 can be planarized using a process such as etching, polishing, or chemical mechanical planarization CMP to make subsequent processing more efficient as shown is FIG. 2 after the planarizing step.

As shown in FIG. 3(*a*), the method can also include the step of forming an additional insulating layer 25 and metal layer 26 using conventional photolithography and etching or metal damascene processes. The insulating layer 25 can be made of the same material as the insulator 24. Suitable materials for the insulating layer 24 and the insulator 14FC can include silicone, epoxies, plastics and dry films deposited using a process such as screen printing, 3D printing, molding, or any other method that can place the insulating material. The metal layer 26 can be deposited by using various methods such as evaporation, sputtering, electroplating, screen printing, damascene or any other method that could place the conductive material. In addition, the metal layer 26 can comprise aluminum, copper, gold, silver or another conductive metal or transparent conductive material such as ITO. The metal layer 26 functions as the first layer of a circuit to build the circuitry as designed to make the light emitting device LED arrays. If needed, the metal layer 26 and the insulating layer 24 can be planarized using a process such as etching, polishing, or chemical mechanical planarization CM) to make subsequent processing more efficient as shown in FIG. 3(*b*).

Figure 3B:
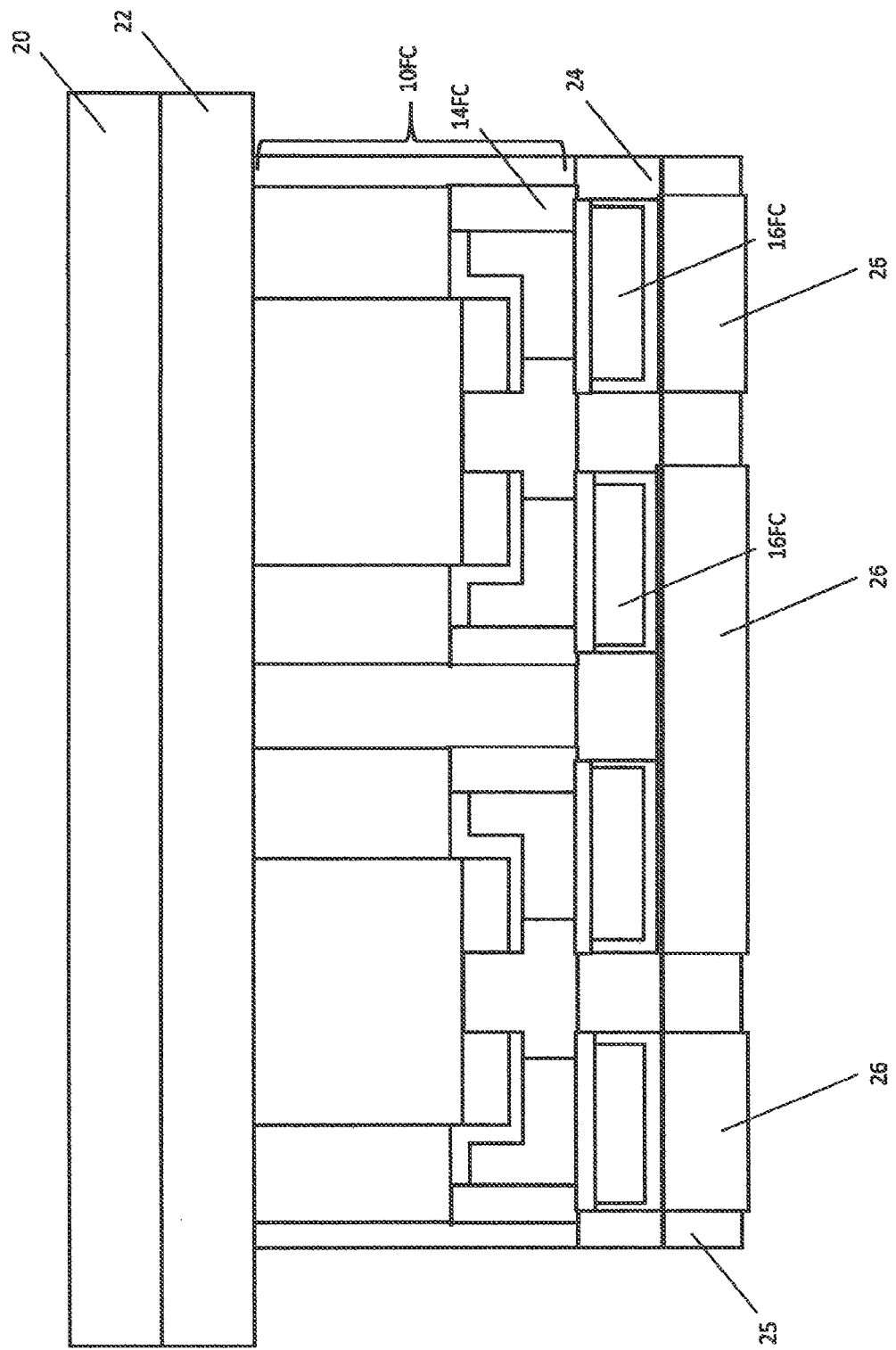
FIG. 3(b) is a schematic cross sectional view illustrating a step of forming a metal layer in the method.
Figure 4:
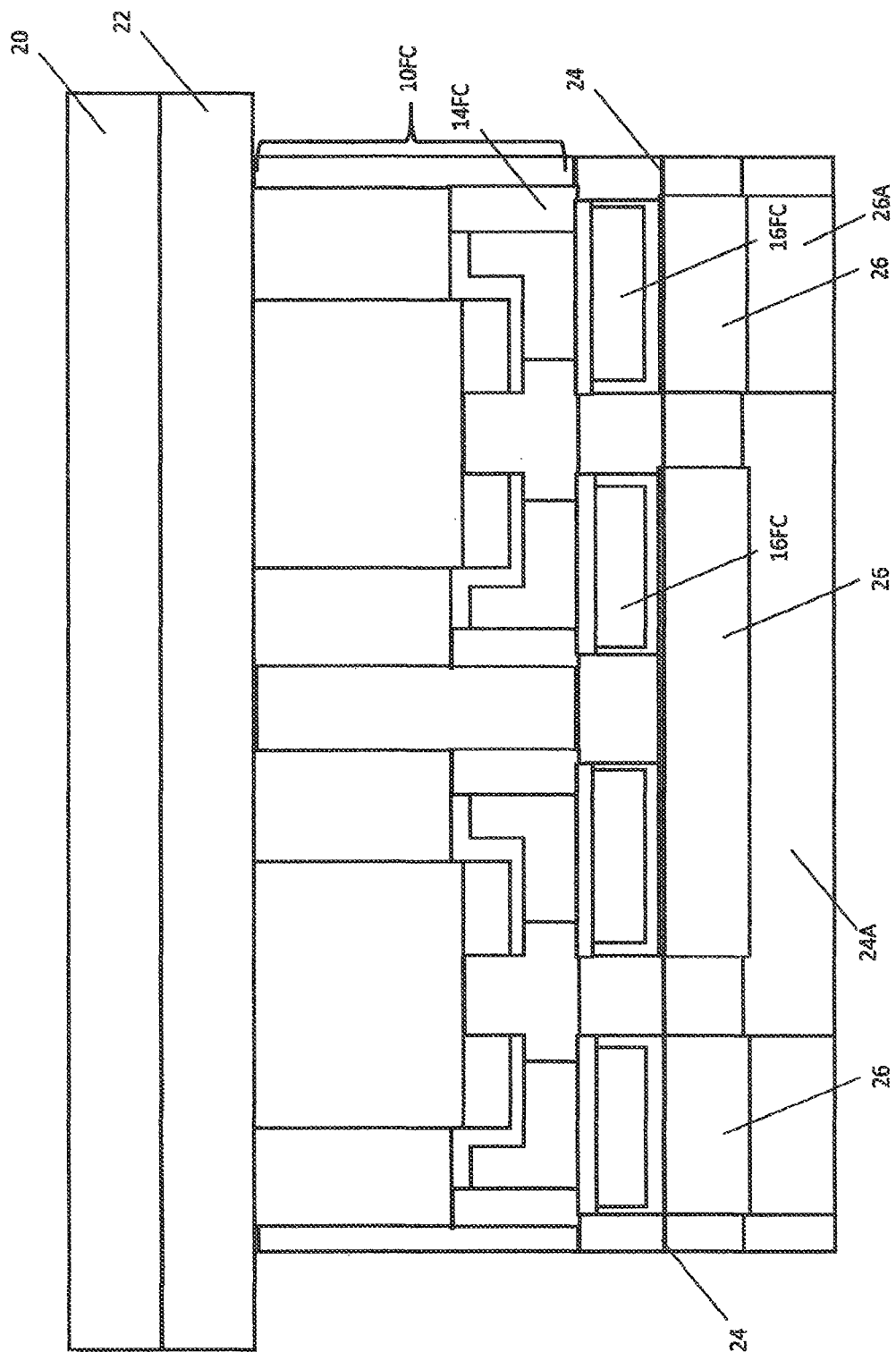
FIG. 4 is a schematic cross sectional view illustrating a step of forming a second insulating layer and a second metal layer in the method.
Figure 5:
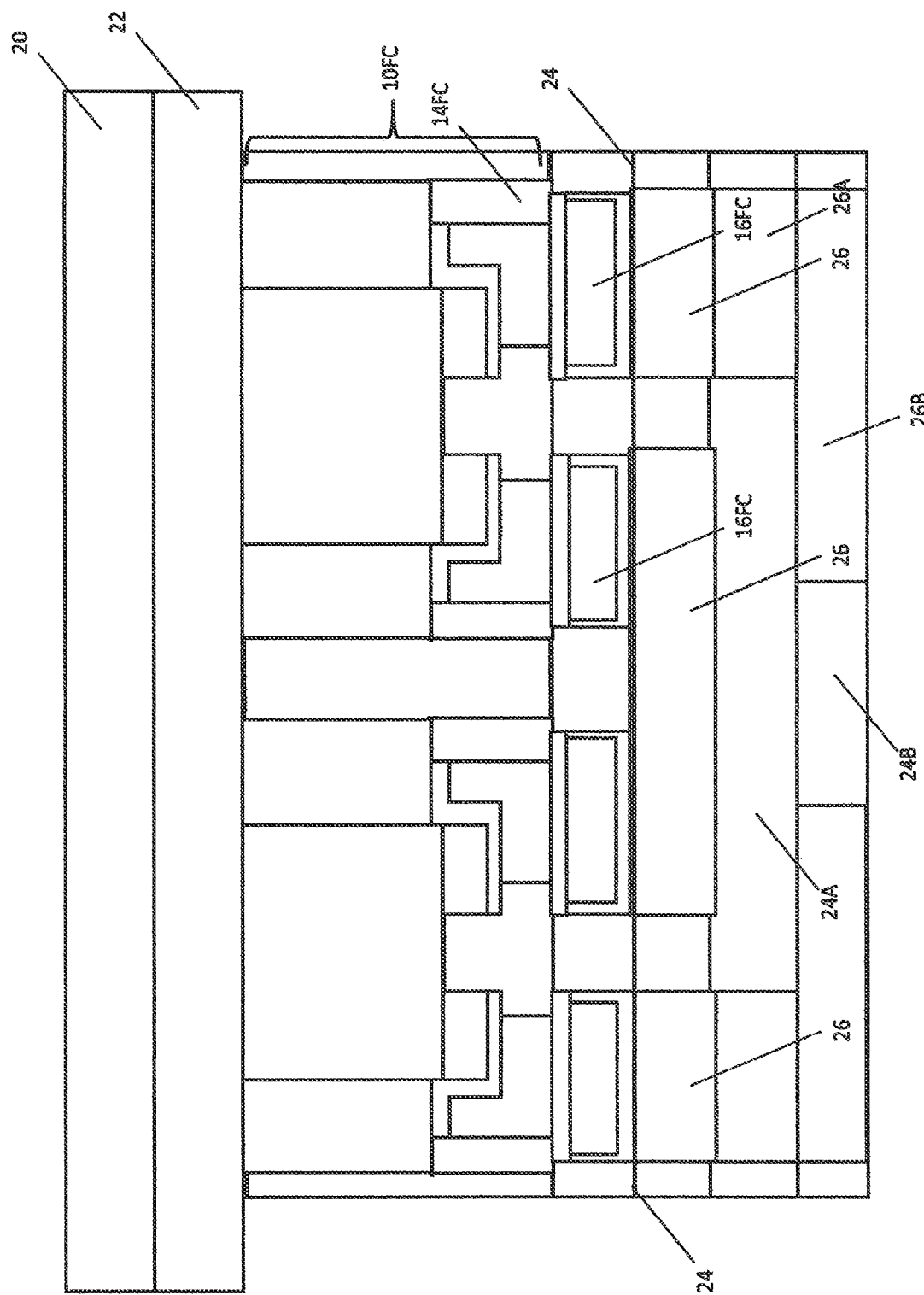
FIG. 5 is a schematic cross sectional view illustrating a step of forming a third insulating layer and a third metal layer in the method.

As shown in FIG. 4, the method can also include the step of forming a second insulator layer 24A and a second metal layer 26A acting as a metal vias to connect the first metal layer to the third metal layers 26B in FIG. 5 using the processes previously described and shown in FIGS. 3*a* and 3*b*.

As shown in FIG. 5, the method can also include the step of forming a third insulator layer 24B and a third metal layer 26B using the processes previously described and shown in FIGS. 3*a* and 3*b*.

Figure 6:
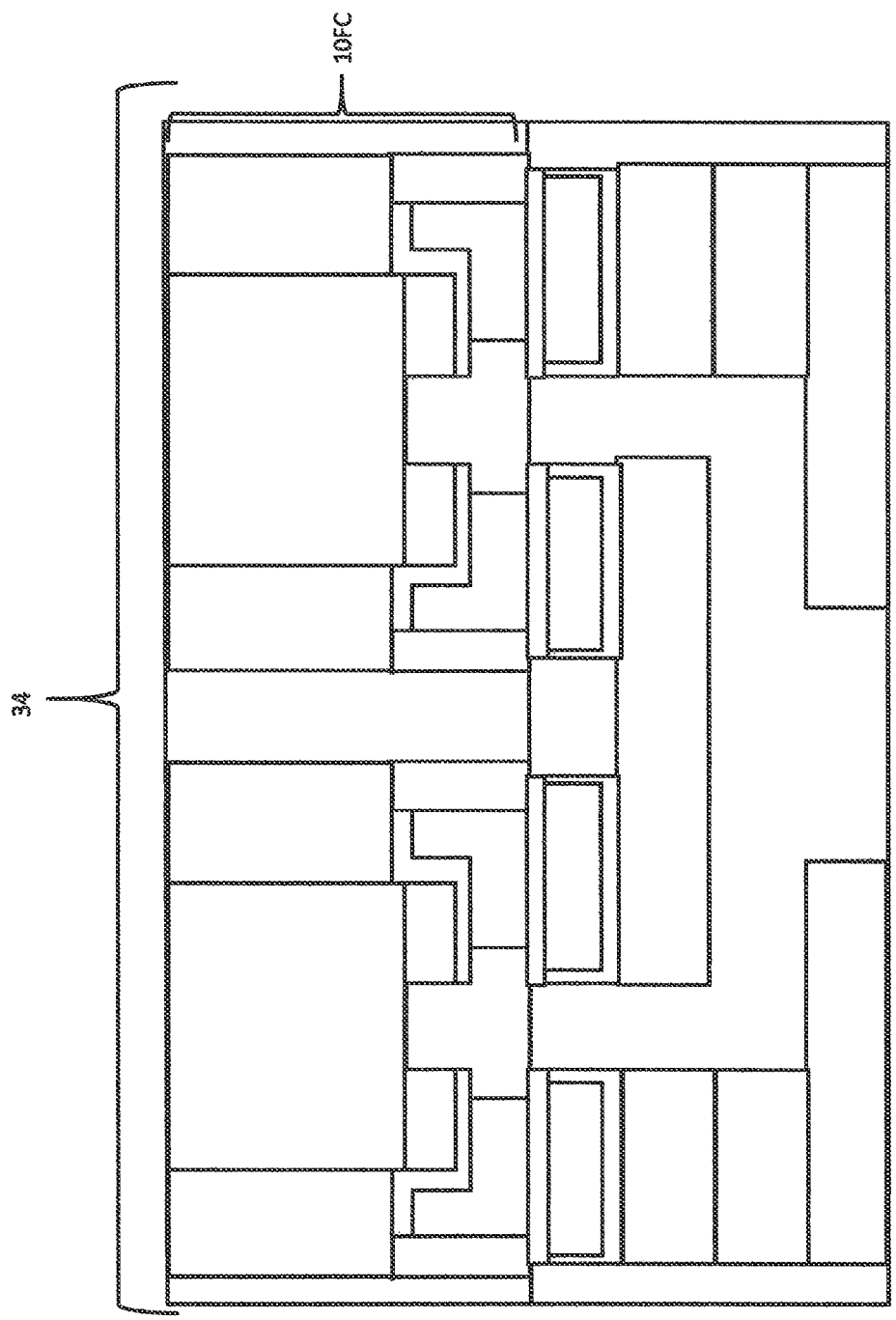
FIG. 6 is a schematic cross sectional view illustrating a step of separating the LED array from the carrier substrate and the temporary substrate.

As shown in FIG. 6, the method can also include the step of separating the completed array 34 from the carrier substrate 20 and the temporary substrate 22. This step can be performed using a process such as physical separation with heating, polishing or chemical mechanical planarization (CMP). By repeating the step of forming insulator and metal layer, a desired circuitry for the LED array can be formed.

Figure 7A:
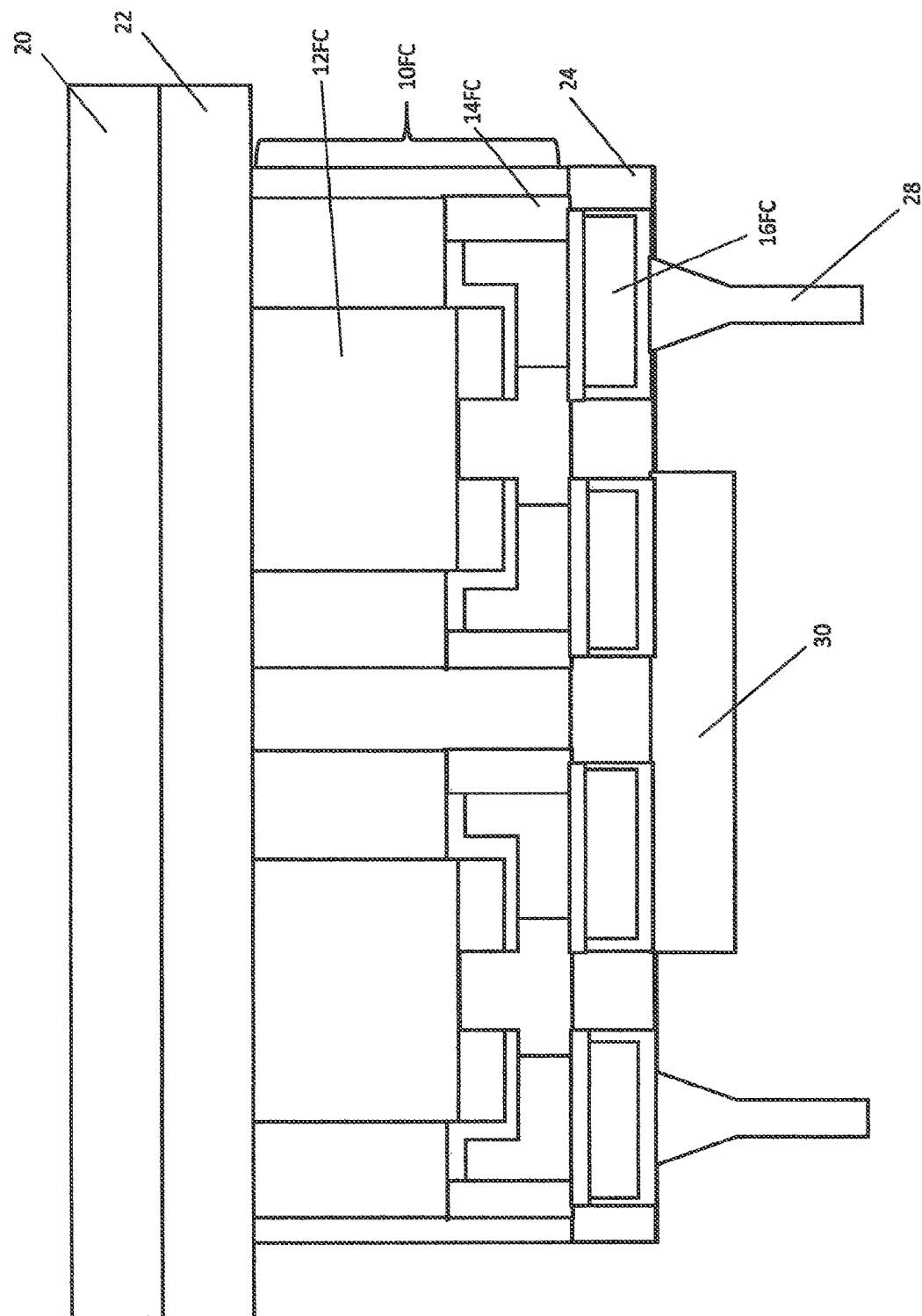
FIGS. 7(a)-7(c) are schematic cross sectional view illustrating an alternate embodiment of the method wherein metal posts are formed.
Figure 7B:
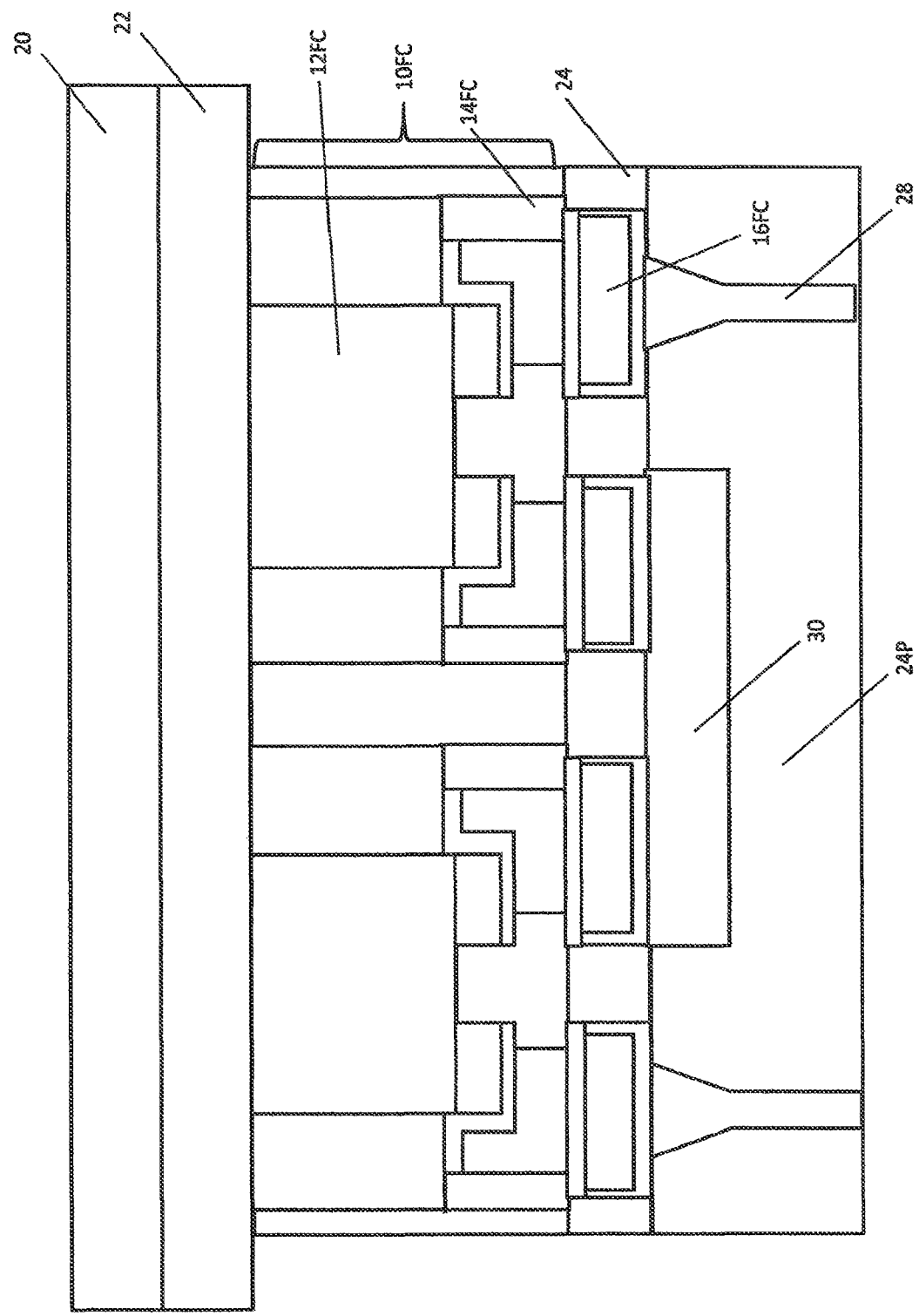
Figure 7C:
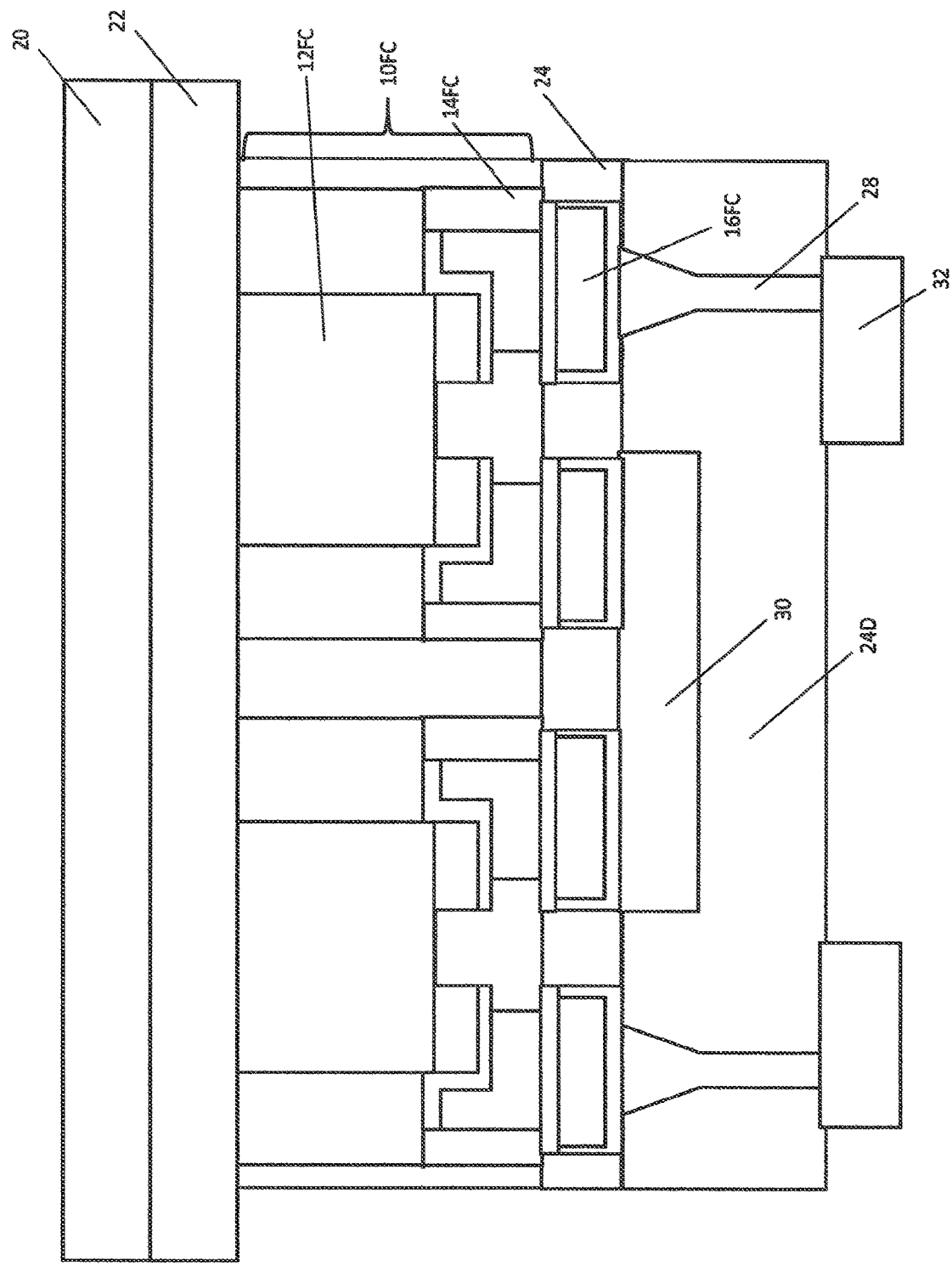

FIGS. 7(*a*)-7(*c*) illustrate an alternate embodiment of the method. As shown in FIG. 7(*a*), the alternate method can include the step of forming metal posts 28 and a circuit connection layer 30 rather than the previously described insulator layer 24 (FIG. 3(*a*)) and metal layer 26 (FIG. 3(*b*)). The metal posts 28 facilitate handling and circuit connections. The metal posts 28 can be formed using a suitable process such as electroplating, wire bonding or friction bonding.

As shown in FIG. 7(*b*), the alternate method can also include the step of forming a post insulator layer 24P, followed by a planarization step such as etching, polishing or CMP (chemical mechanical planarization). This type of planarization step can also be employed with any of the previously described deposition processes, such as following formation of the insulator layer 24 (FIG. 3(*a*)) and the metal layer 26 (FIG. 3(*b*)).

As shown in FIG. 7(*c*), the method can also include the step of forming a post connection layer 32.

Figure 8:
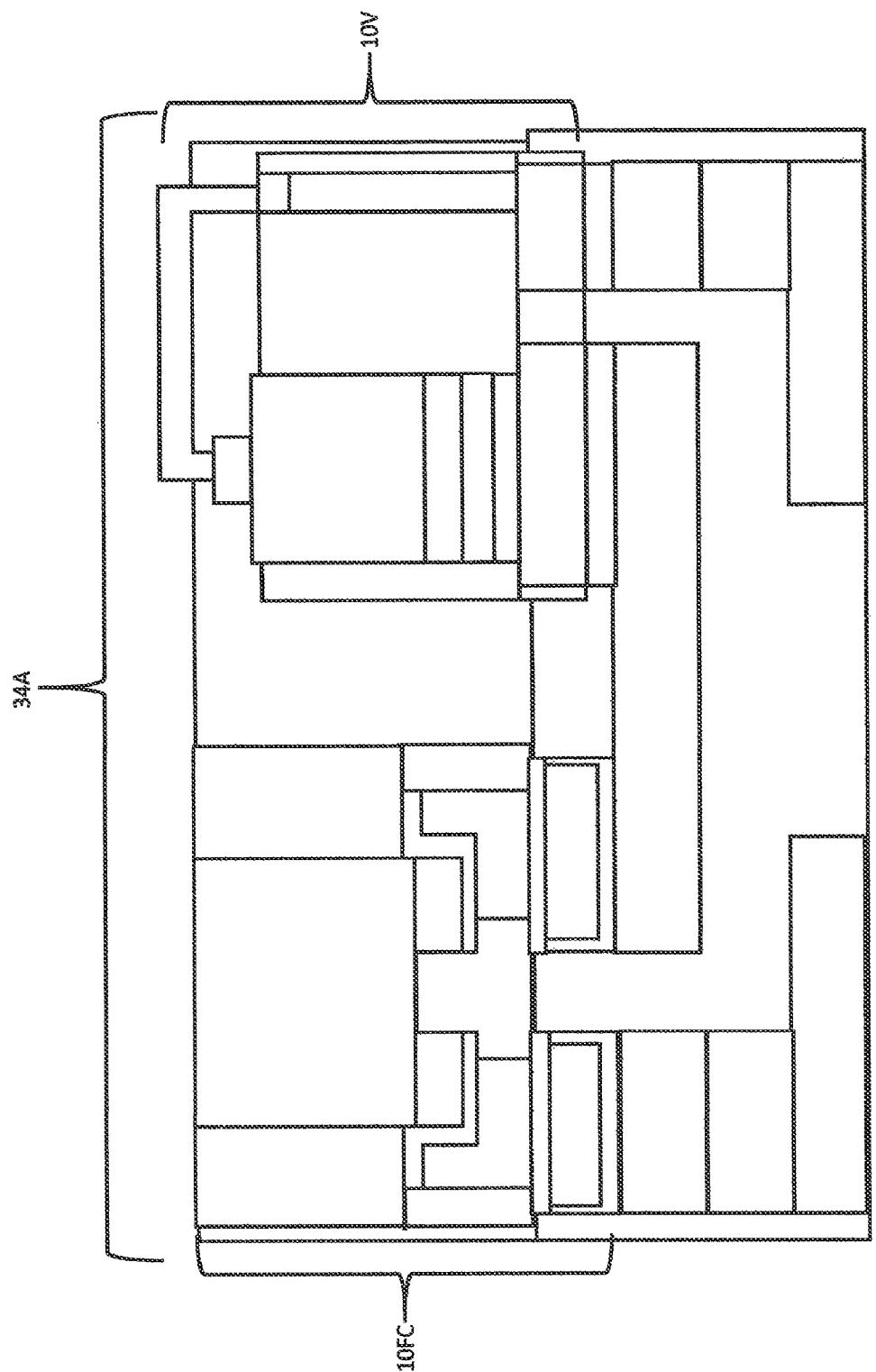
FIG. 8 is a schematic cross-sectional view illustrating a LED array having a mixture of a flip chip CSP and a vertical CSP formed using the method.

As shown in FIG. 8, the method can be used to make an array 34A that includes a mix of flip chip CSP 10FC and vertical CSP 10V. In addition, FIG. 8 shows the additional step of separating the carrier substrate 20 and the temporary substrate 22.

Figure 9:
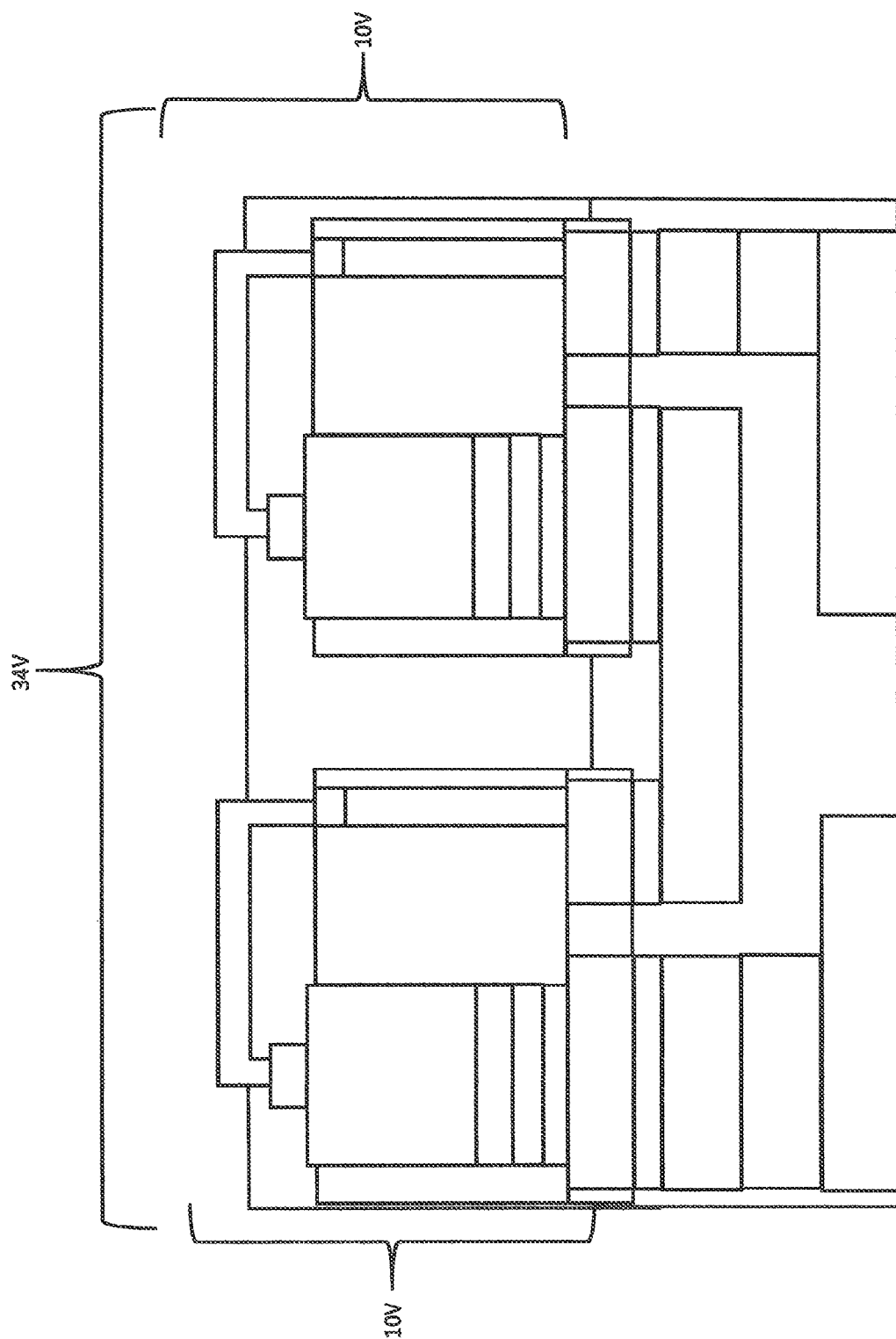
FIG. 9 is a schematic cross-sectional view illustrating a LED array having vertical CSPs formed using the method.

As shown in FIG. 9, the method can be used to make an array 34V that includes only vertical CSPs 10V.

Figure 10:
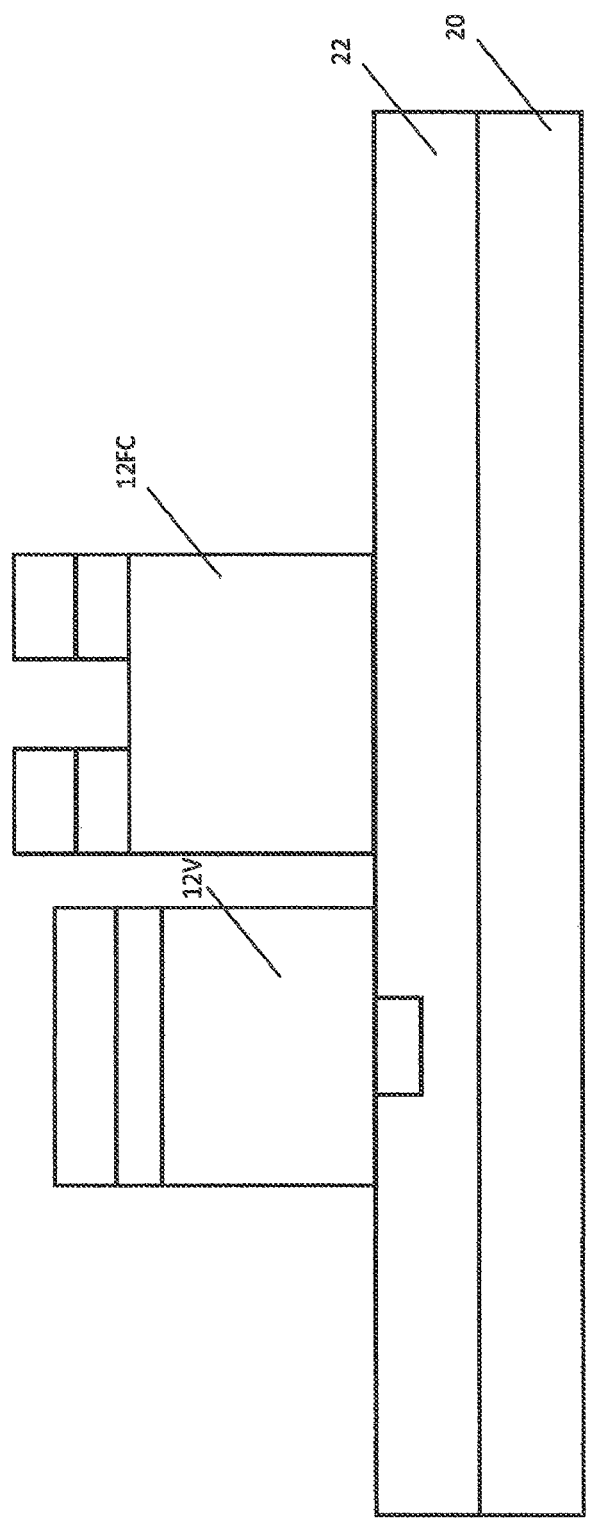
FIG. 10 is a schematic cross-sectional view illustrating a step of attaching bare LED dice to a carrier substrate and to a temporary substrate in an alternate method for making light emitting device LED arrays.

Referring to FIG. 10, an alternate embodiment of the method wherein bare LED dice, rather than packaged LED are used to make the LED arrays. As shown in FIG. 10, the method can include the step of attaching n number of LED dice to a carrier substrate 20 and to a temporary substrate 22. In the illustrative embodiment, the LED dice comprise a vertical LED die 12V and a flip chip LED die 12FC.

However, the method can be performed with other types of LED die, such as planar LED dice 14H (FIG. 1), and any number of LED dice greater than two. The vertical LED die 12V and the flip chip LED die 12FC can be attached to the temporary substrate 22 using a mechanical process such as a pick and place process. Depending on the temporary substrate 22 a curing step can also be performed to cure the temporary substrate 22.

Figure 11:
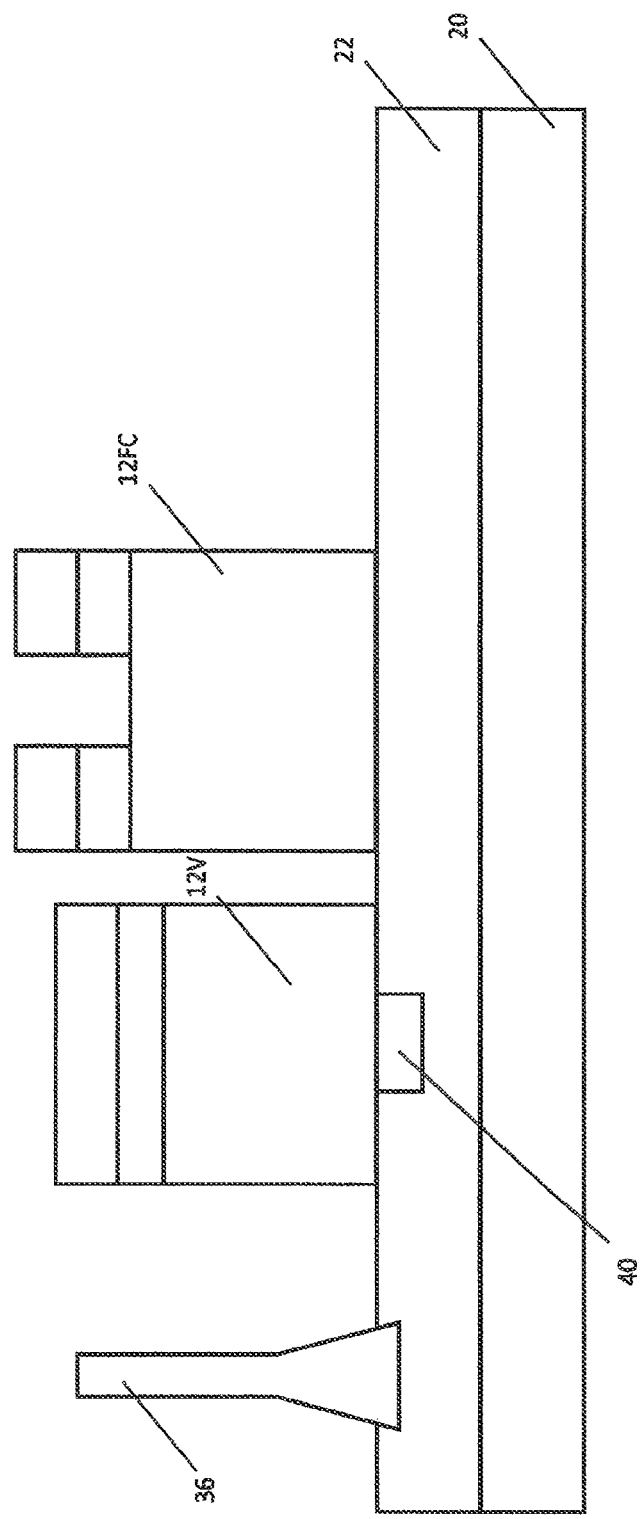
FIG. 11 is a schematic cross-sectional view illustrating a step of forming a metal post on the temporary substrate in electrical communication with the bare LED dice in the alternate method.

As shown in FIG. 11, the method can also include the step of forming a metal post 36 on the temporary substrate 22 in electrical communication with the vertical LED die 12V and the flip chip LED die 12FC. The temporary substrate 22 can also include any desired circuitry for configuring the LED array with a desired circuit arrangement. For example, the temporary substrate 22 can include traces (not shown) that make a desired circuit that includes the vertical LED die 12V and the flip chip LED die 12FC. The metal post 36 can be formed using a suitable process such as electroplating, placement of a pre-made post or deposition through a variety of methods.

Figure 12:
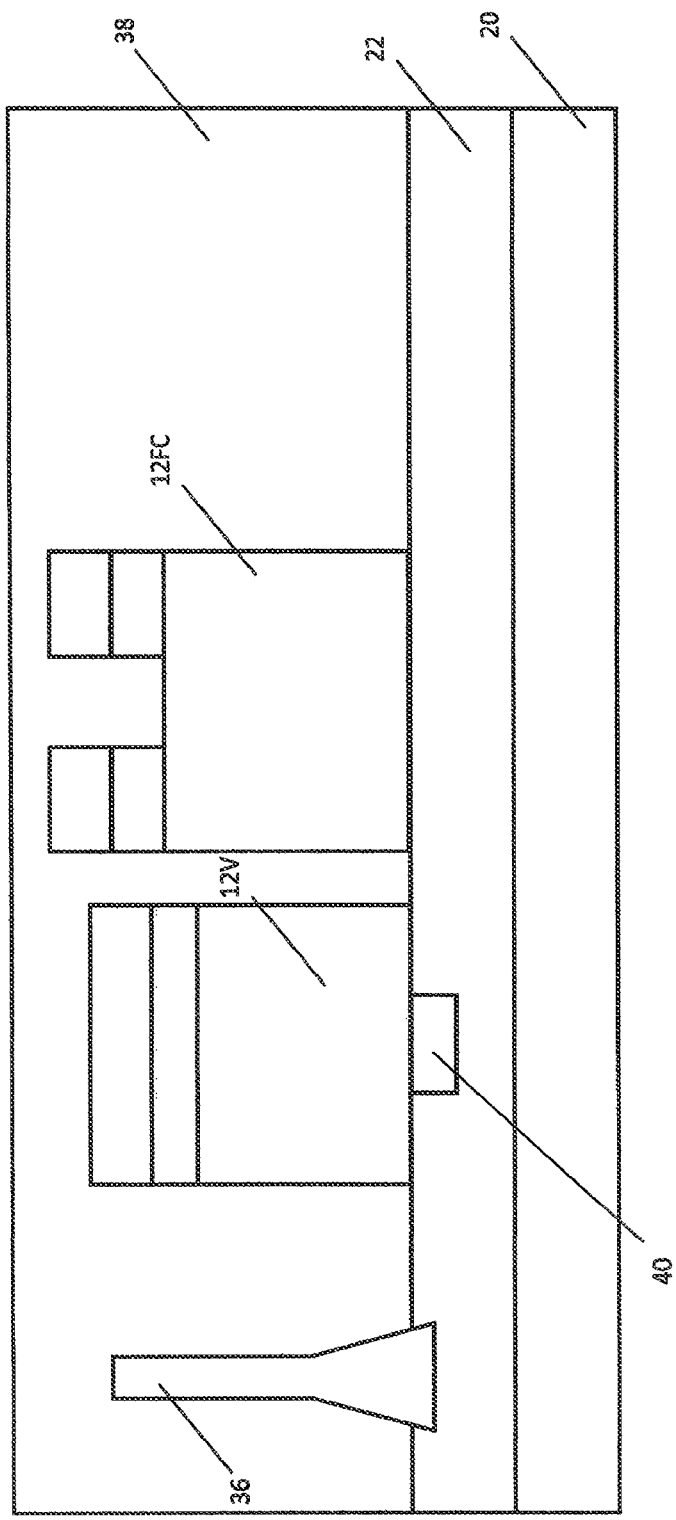
FIG. 12 is a schematic cross-sectional view illustrating a step of forming an encapsulant on the metal post and on the bare LED dice in the alternate method.

As shown in FIG. 12, the method can also include the step of forming an electrically insulating encapsulant 38 covering the metal post 36, the vertical LED die 12V, the flip chip LED die 12FC and the surface of the temporary substrate 22. The encapsulant 38 can comprise a dry film, an epoxy, silicon nitride, spin-on-glass (SOG) or similar materials. The encapsulant 38 can be deposited to a desired thickness using a process such as screen-printing, physical deposition or other similar method.

Figure 13:
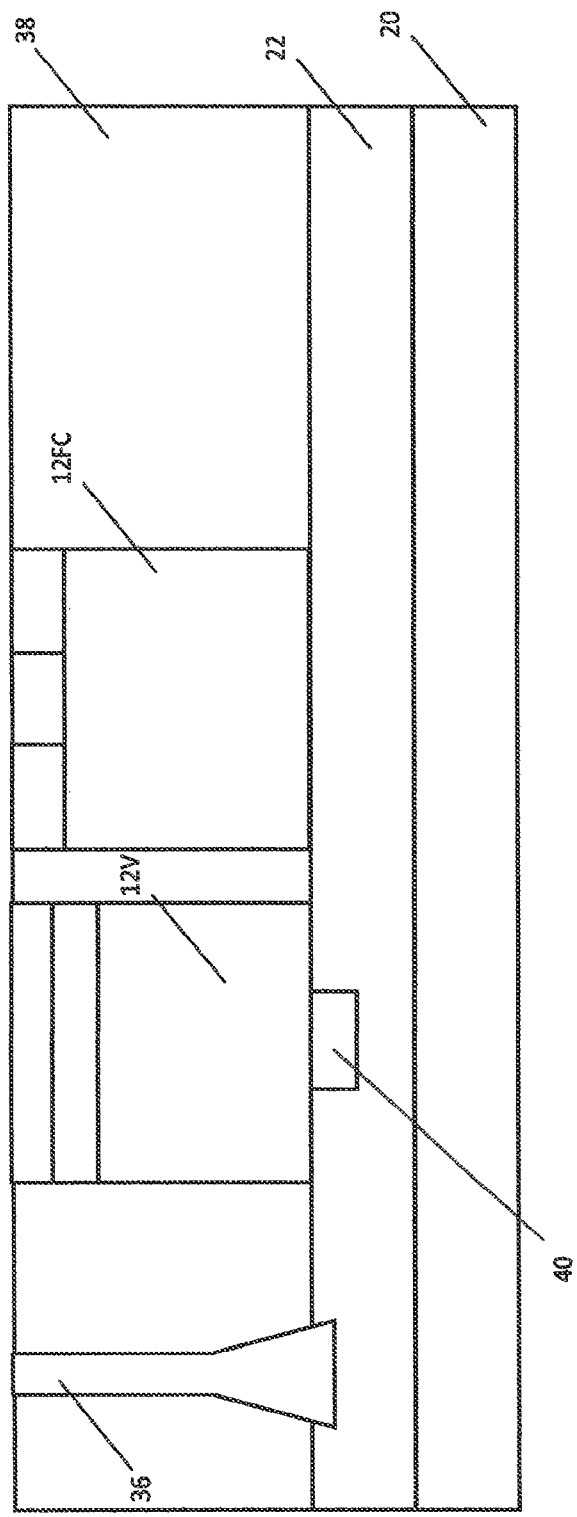
FIG. 13 is a schematic cross sectional view illustrating a step of planarizing the encapsulant in the alternate method.

As shown in FIG. 13, the method can include the step of planarizing the encapsulant 38 using a suitable process such as etching, polishing or chemical mechanical planarization CMP.

Figure 14:
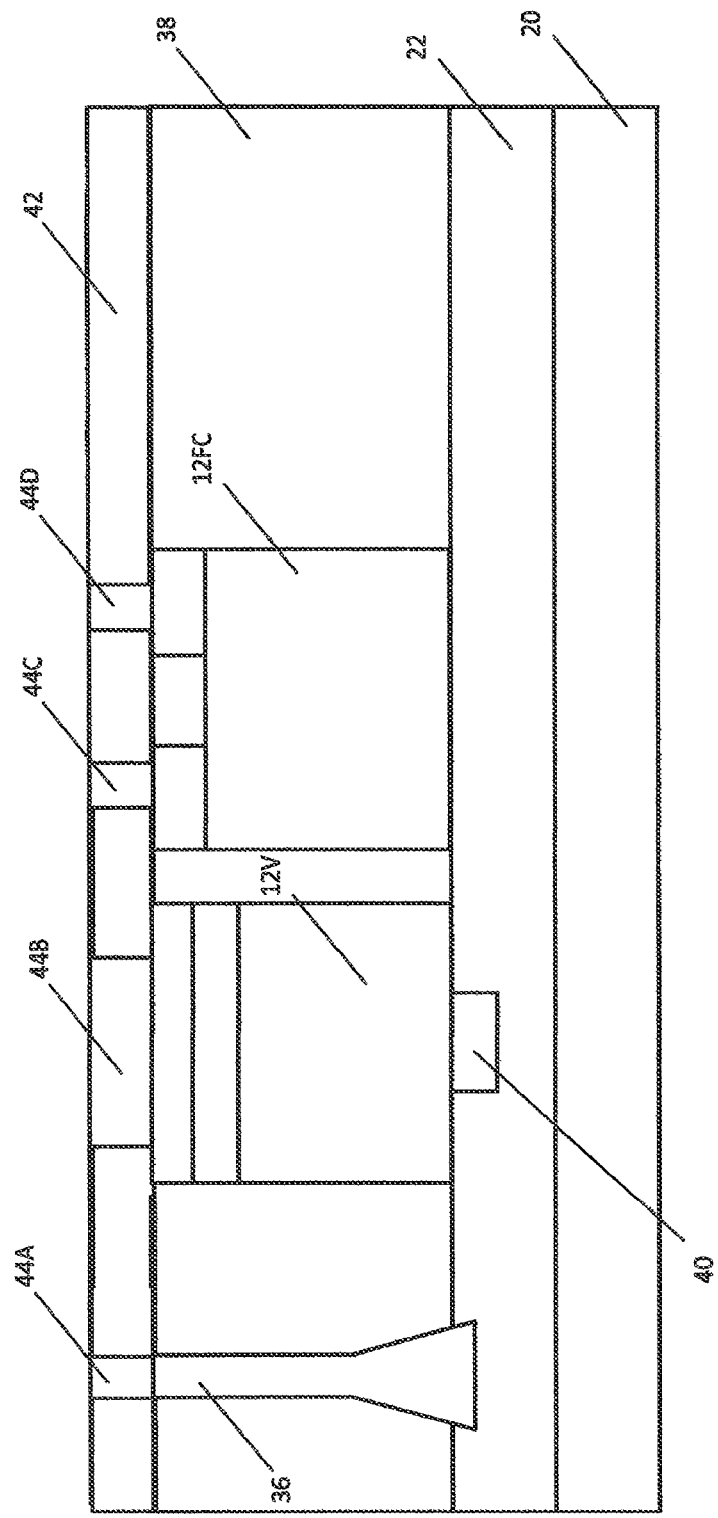
FIG. 14 is a schematic cross sectional view illustrating a step of forming a metal layer in electrical contact with the metal post and the bare LED dice in the alternate method.
Figure 15:
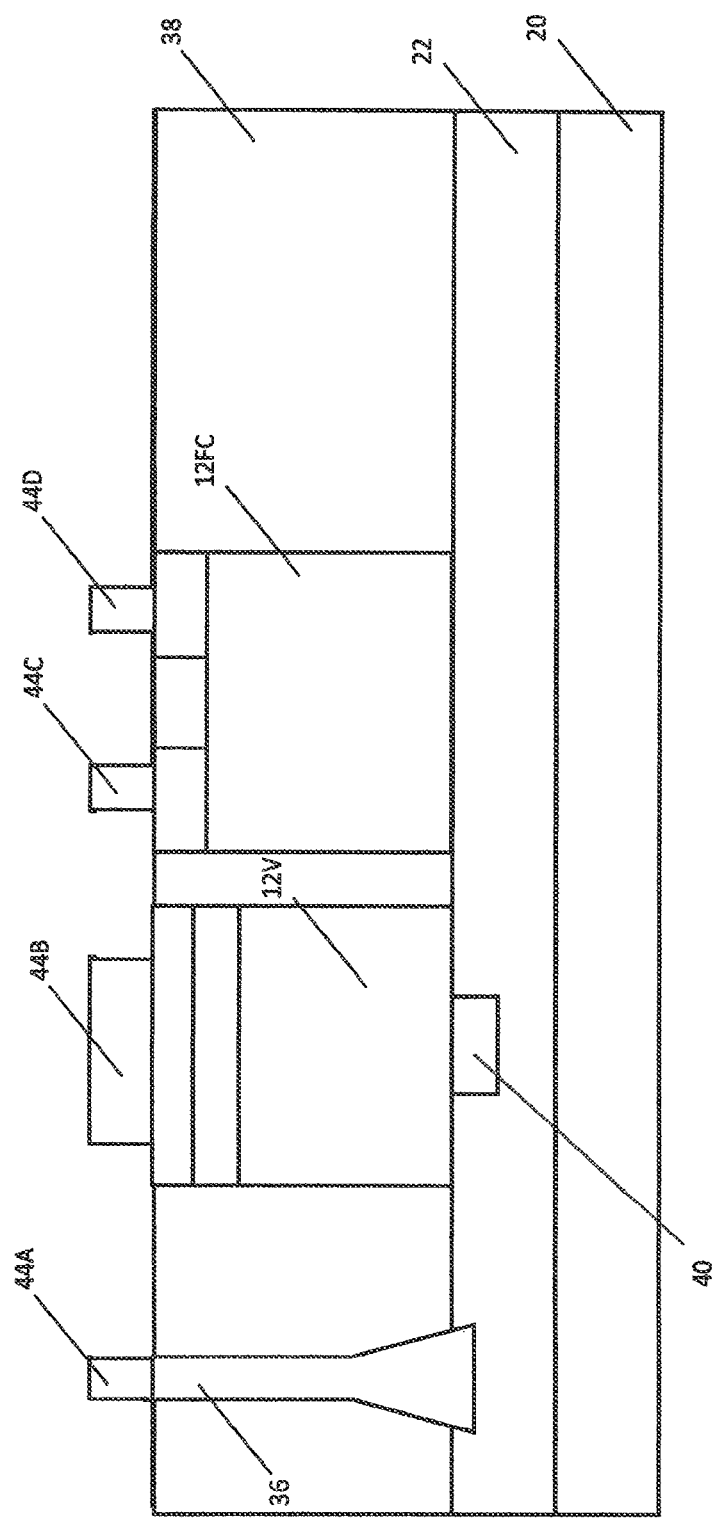
FIG. 15 is a schematic cross sectional view illustrating a step of forming extended pads in electrical contact with the metal post and the bare LED dice in the alternate method.

As shown in FIGS. 14 and 15, the method can also include the steps of depositing a layer of photoresist 42, patterning the layer of photoresist 42, forming an extended pad 44A in electrical contact with the metal post 36, an extended pad 44B in electrical contact with the anode or the cathode of the vertical LED die 12V, and extended pads 44C, 44D in electrical contact with the anode and cathode of the flip chip LED die 12FC. Following formation of the extended pads 44A-44D, the layer of photoresist 42 can be stripped using a suitable process. In addition to the extended pads 44A-44D, the layer of photoresist 42 can be used to make other circuit traces (not shown) for configuring the LED array in a desired circuit.

Figure 16:
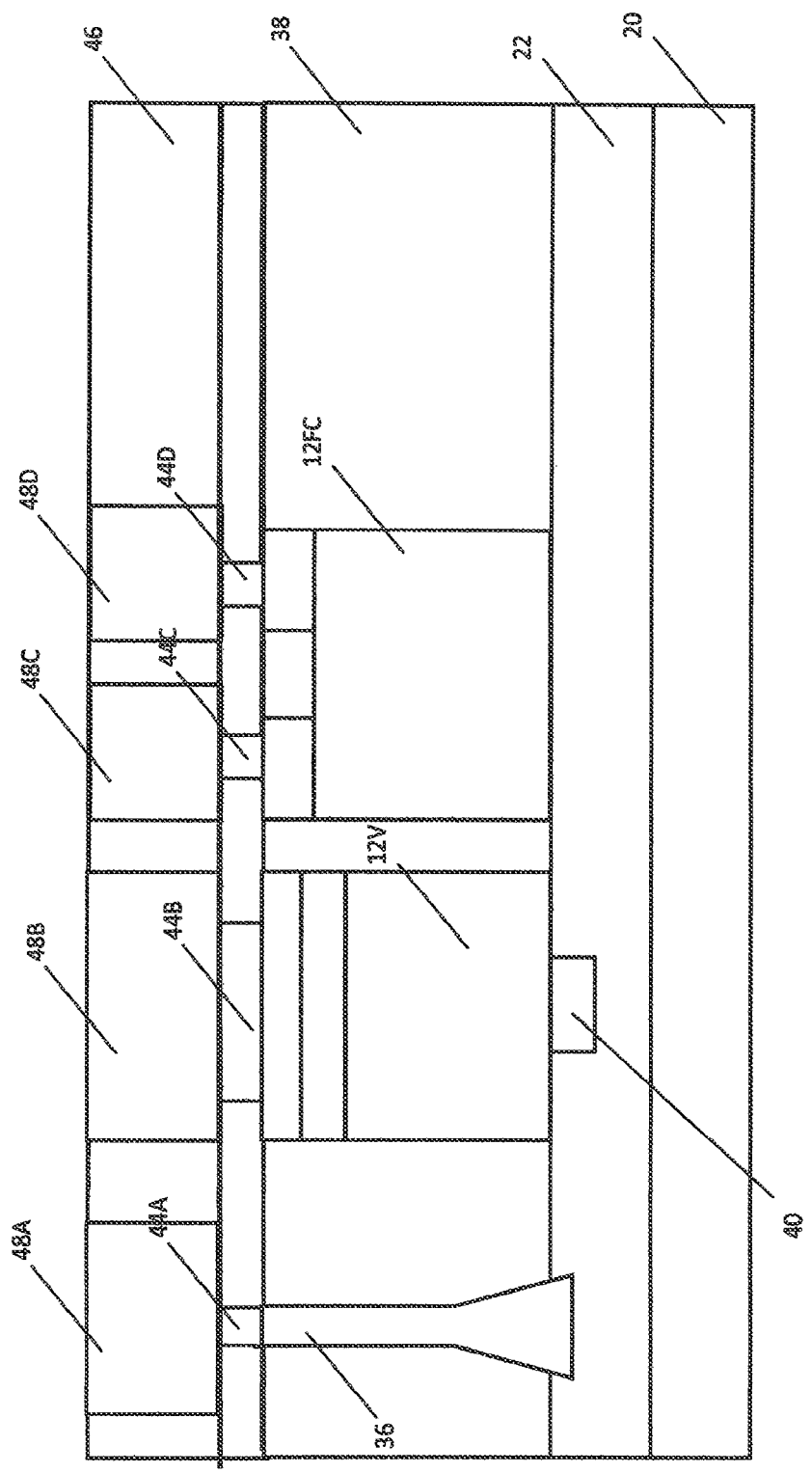
FIG. 16 is a schematic cross sectional view illustrating a step of enlarging the extended pads in the alternate method.

As shown in FIG. 16, the method can also include the step of forming a second encapsulant 46 and enlarging the extended pads 44A-44D into enlarged extended pads 48A-48D. This step can be performed using an additive deposition process performed by patterning the second encapsulant 46 such as with a UV process, followed by metal deposition, and curing.

Figure 17:
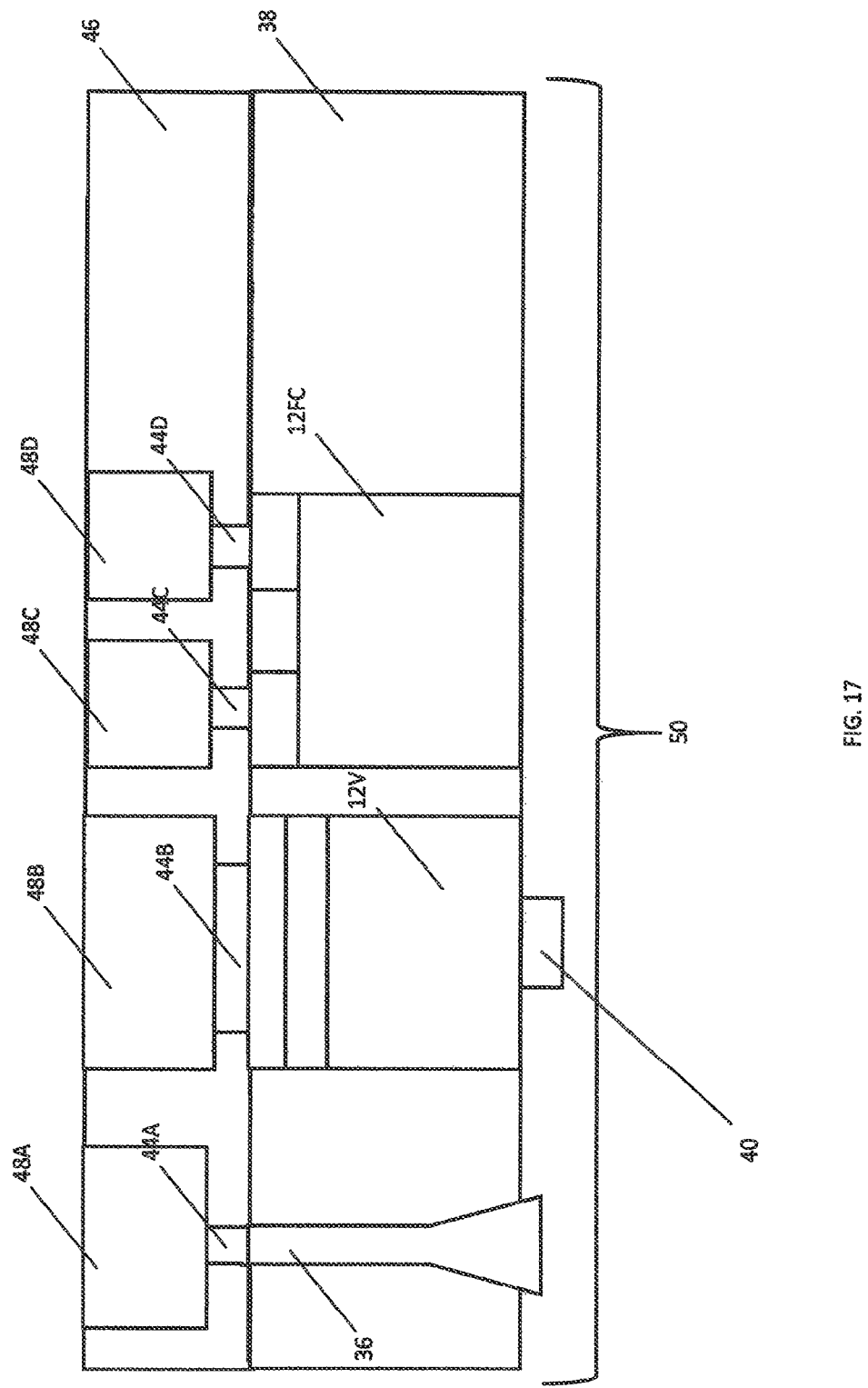
FIG. 17 is a schematic cross sectional view illustrating a step of separating the LED array from the carrier substrate and the temporary substrate.

As shown in FIG. 17, the method can also include the step of separating the LED array 50 from the carrier substrate 20 and the temporary substrate 22. This step can be performed using a process such as physical separation with heating, polishing or chemical mechanical planarization CMP.

Figure 18:
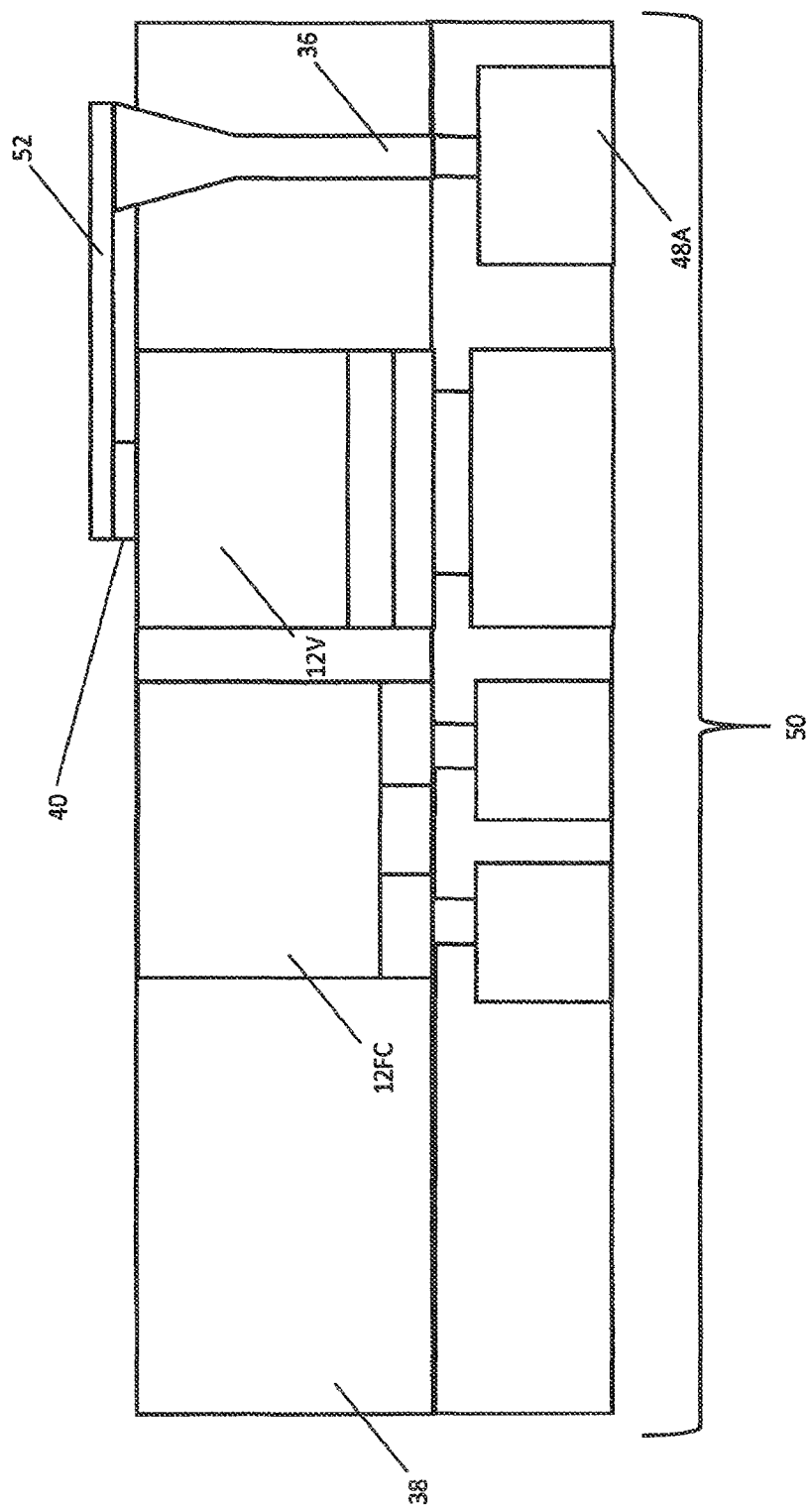
FIG. 18 is a schematic cross sectional view illustrating a step of making electrical connections to the metal post and the bare LED dice.

As shown in FIG. 18, the method can also include the step of making an electrical connector 52 between the metal post 36 and the pad 40 on the vertical LED die 12V. This step can be performed using a process such as wire bonding, wedge bonding, evaporation, PVD, CVD or EP. This last step completes the LED array 50.

Figure 19:
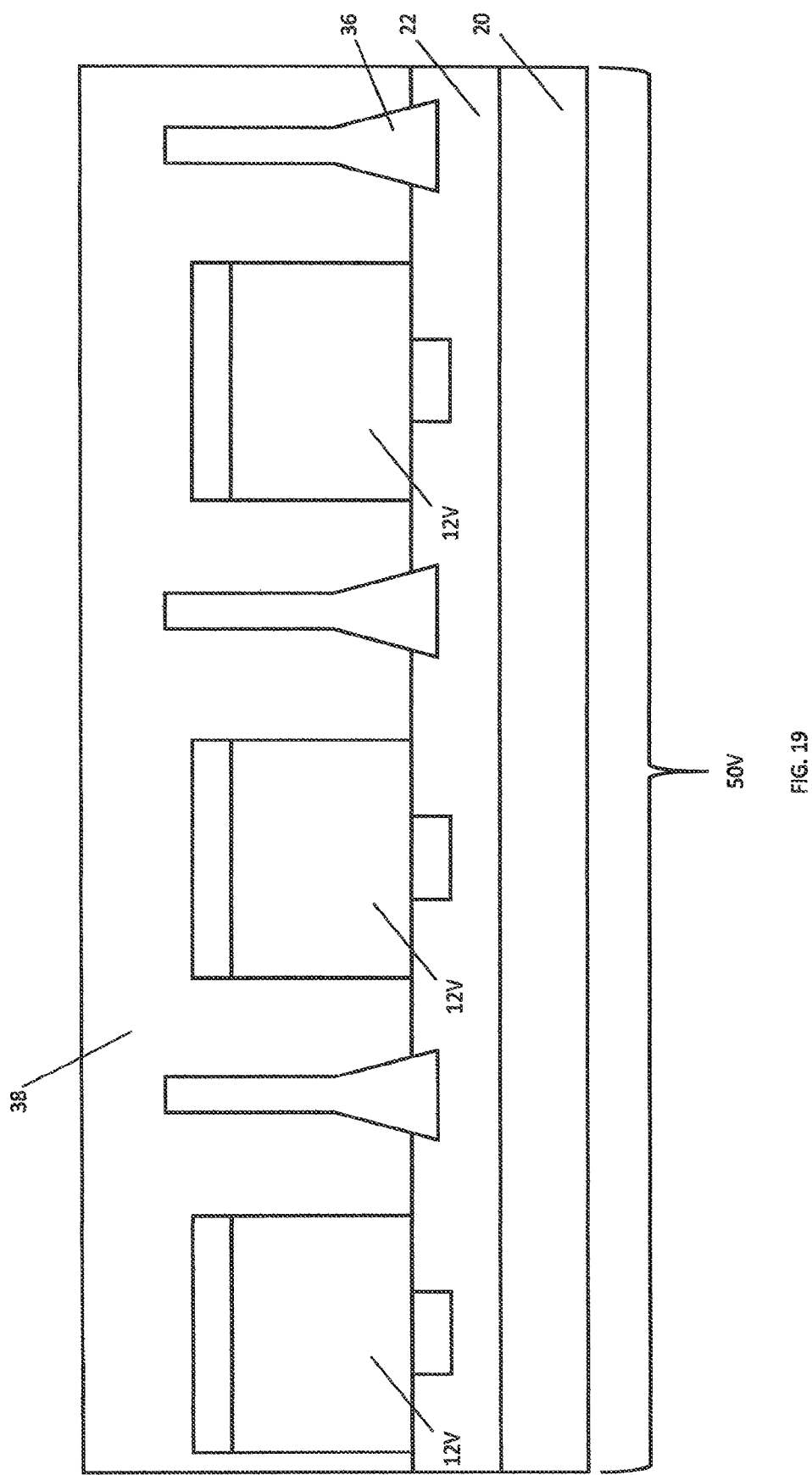
FIG. 19 is a schematic cross sectional view illustrating a LED array constructed using the method with three vertical LED dice.

As shown in FIG. 19, the method can be performed to form a LED array 50V that includes three vertical LED dice 50V. In FIG. 19, the LED array 50V is still bonded to the substrate 20 and the temporary substrate 22, which will subsequently be removed as previously described following further processing.

Figure 20:
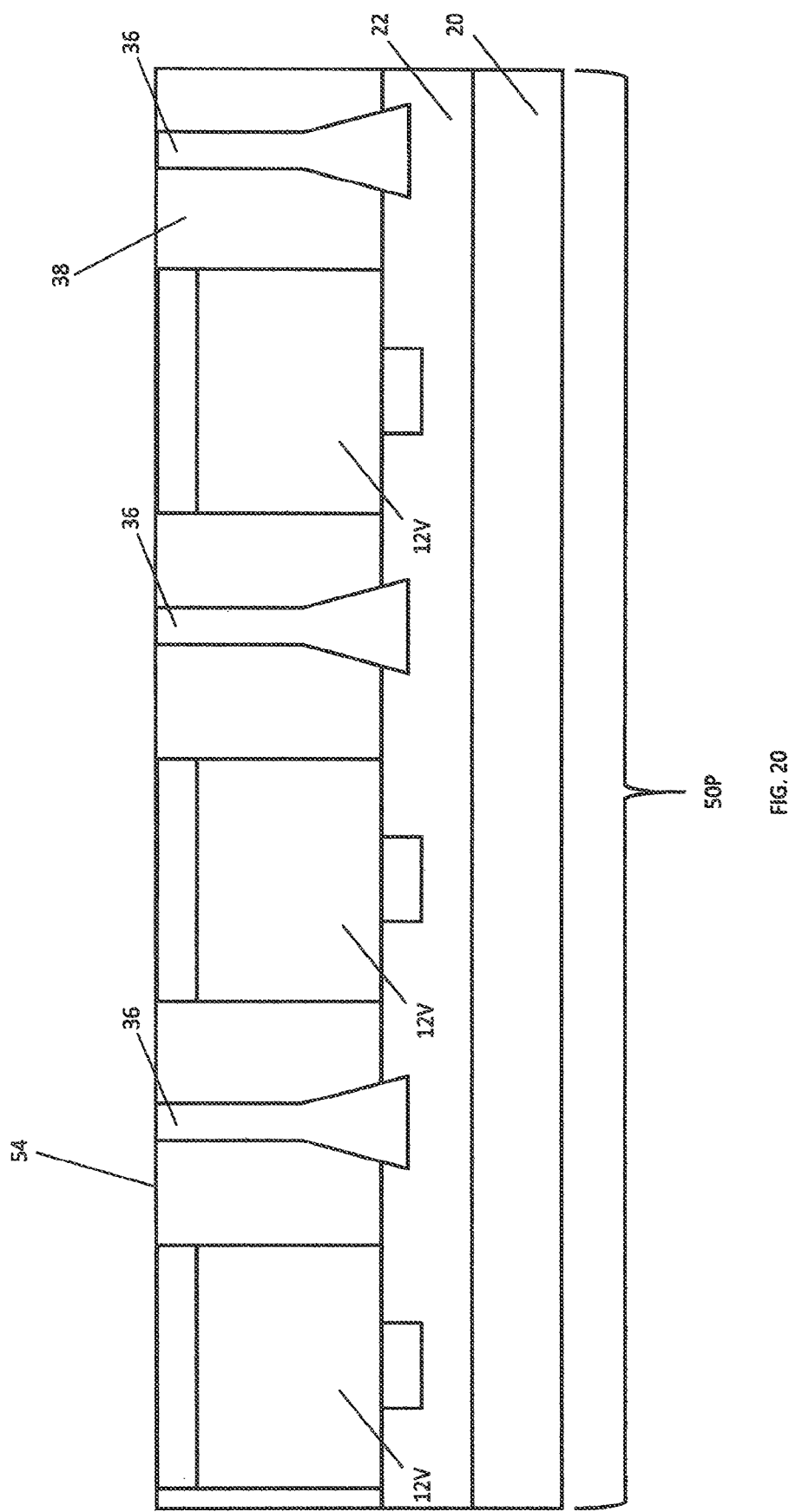
FIG. 20 is a schematic cross sectional view illustrating a LED array constructed using the method with three vertical LED dice and a planarized surface.

As shown in FIG. 20, the method can be performed to form a LED array 50P that includes three vertical LED dice 50V and a planarized surface 54. In FIG. 20, the LED array 50P is still bonded to the substrate 20 and the temporary substrate 22, which will subsequently be removed as previously described following further processing.

Figure 21:
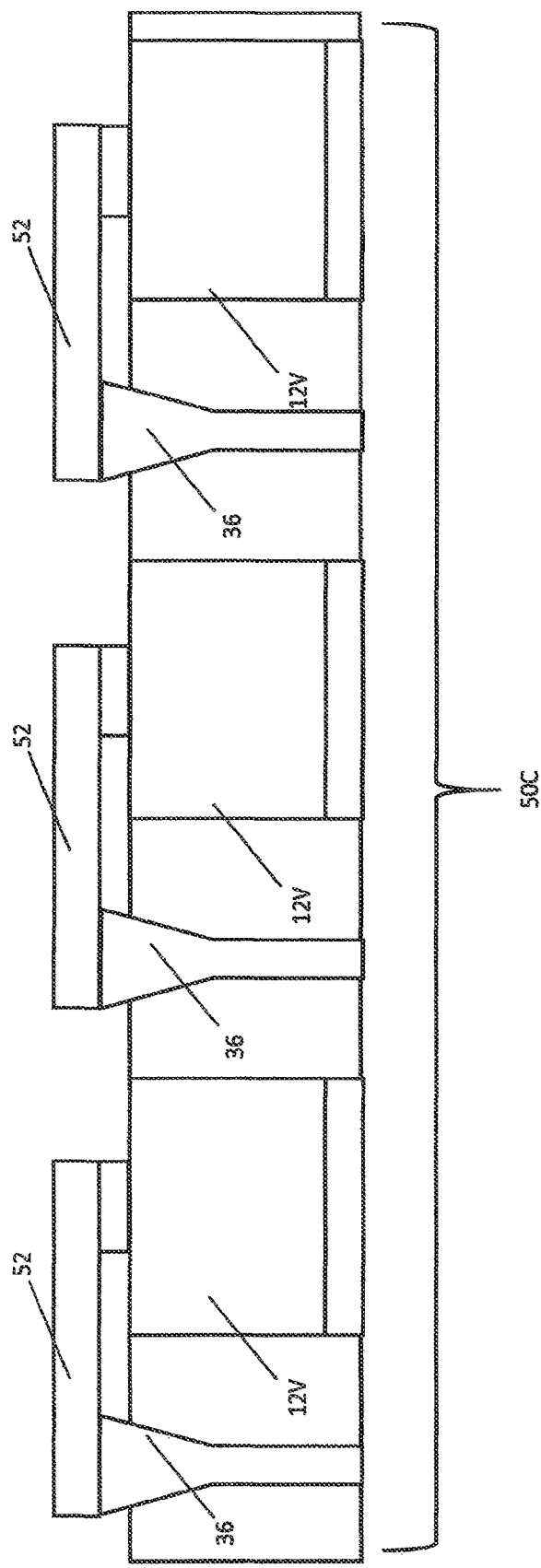
FIG. 21 is a schematic cross sectional view illustrating a LED array constructed using the method with three vertical LED dice and interconnected posts.

As shown in FIG. 21, the method can be performed to form a LED array 50C that includes vertical LED dice 12V interconnected to posts 36 via electrical connectors 52, substantially as previously described.

Figure 22:
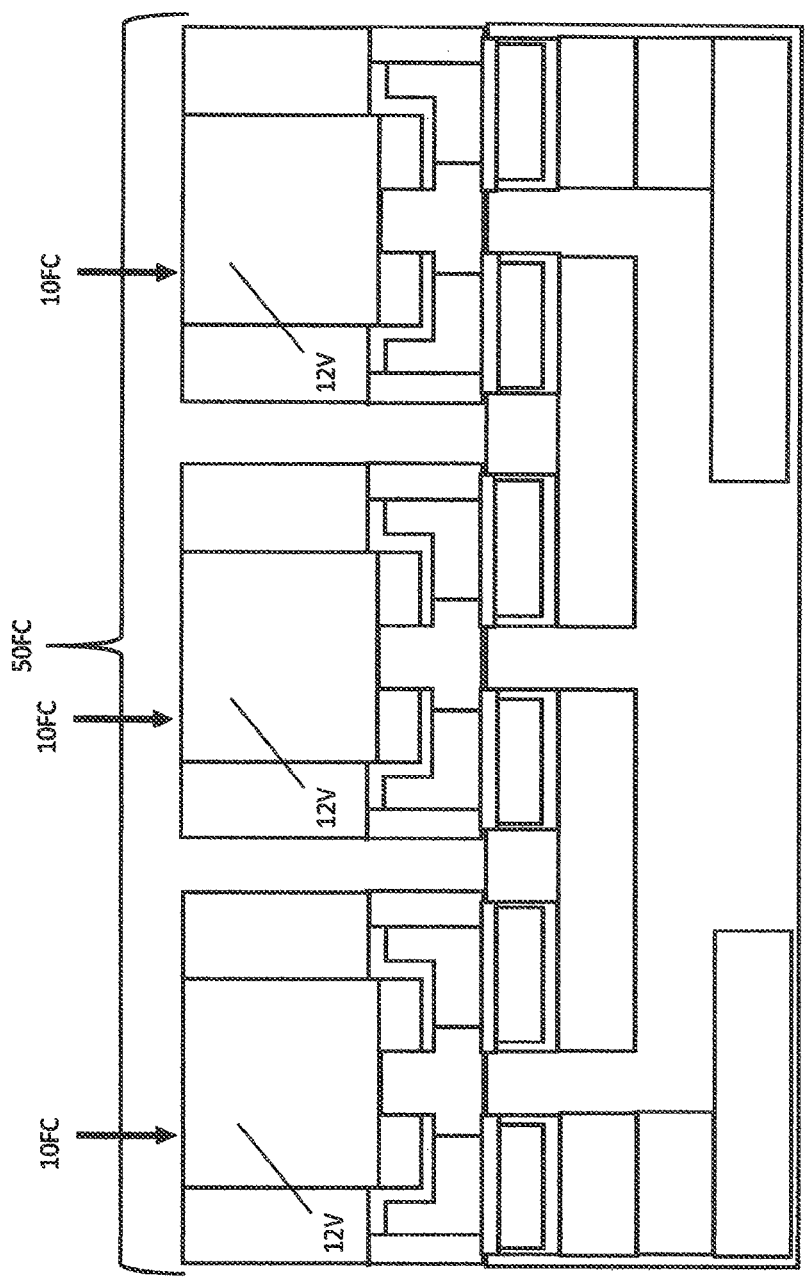
FIG. 22 is a schematic cross sectional view illustrating a flip chip CSP LED array constructed using the method with three flip chip CSPs.

As shown in FIG. 22, the method can be performed to form a flip chip CSP LED array 50FC having flip chip packages 10FC interconnected via an electrical connector system 58 formed substantially as previously described.

Figure 23:
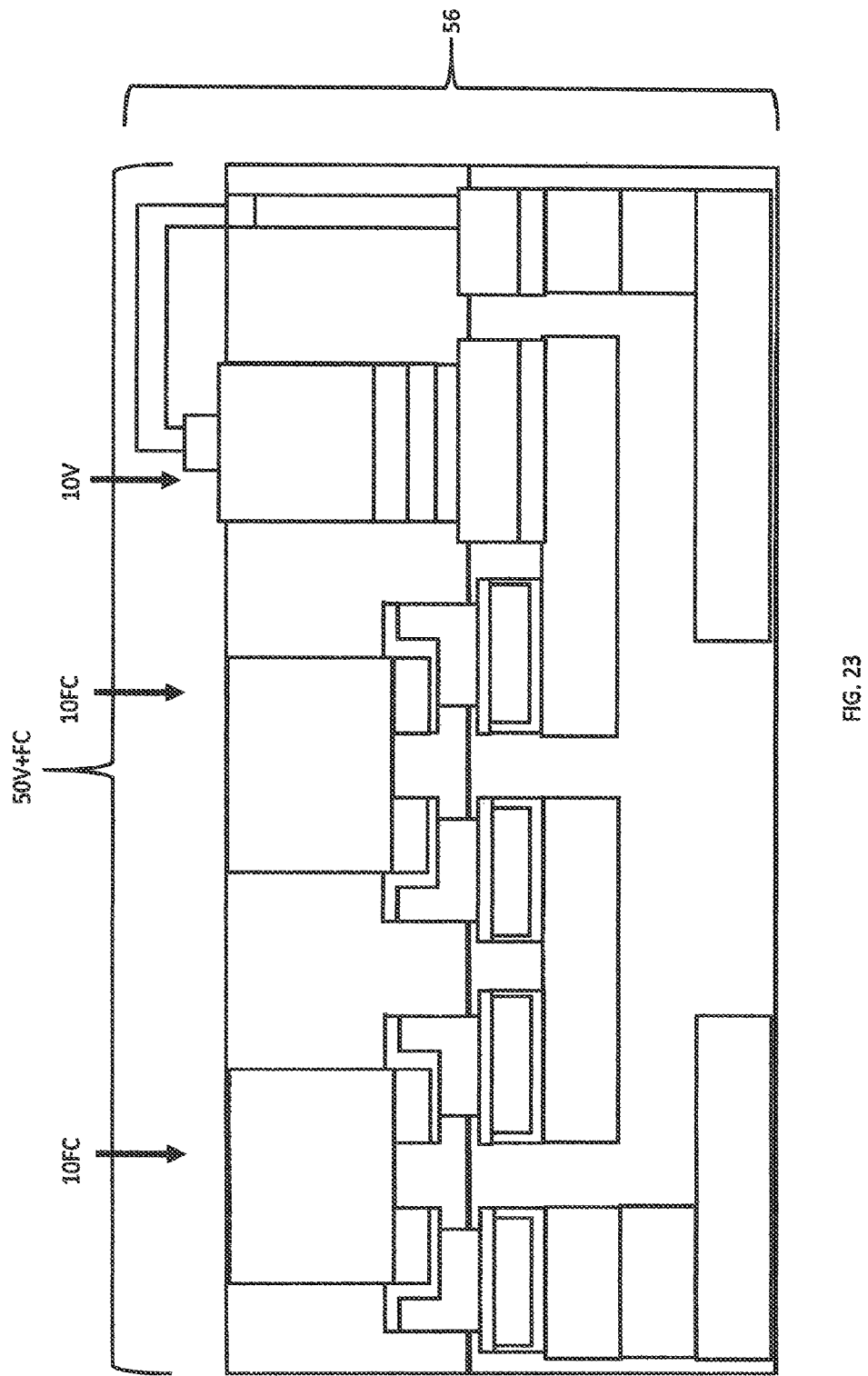
FIG. 23 is a schematic cross sectional view illustrating a combination flip chip CSP vertical CSP LED array constructed using the method with two flip chip CSPs and a vertical CSP.

As shown in FIG. 23, the method can be performed to form a combination flip chip CSP/vertical CSP LED array 50V+FC having flip chip packages 10FC and vertical CSPs 10V interconnected via an electrical connector system 56 formed substantially as previously described.

Figure 24:
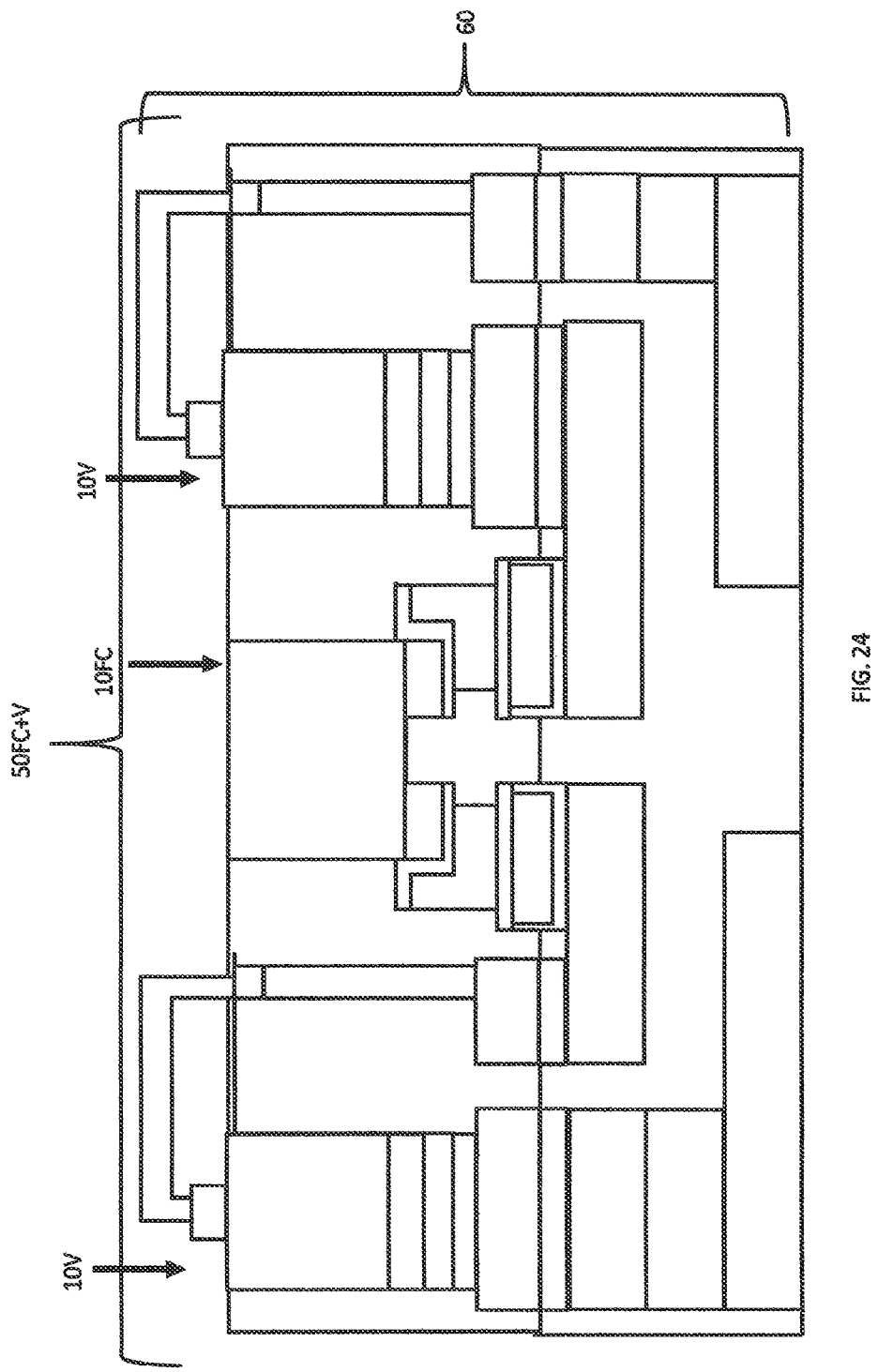
FIG. 24 is a schematic cross sectional view illustrating a combination flip chip CSP vertical CSP LED array constructed using the method with one flip chip CSP and two vertical CSPs.

As shown in FIG. 24, the method can be performed to form a combination flip chip CSP/vertical CSP LED array 50FC+V having vertical CSPs 10V and flip chip CSPs 10FC interconnected via an electrical connector system 60 formed substantially as previously described.

Figure 25:
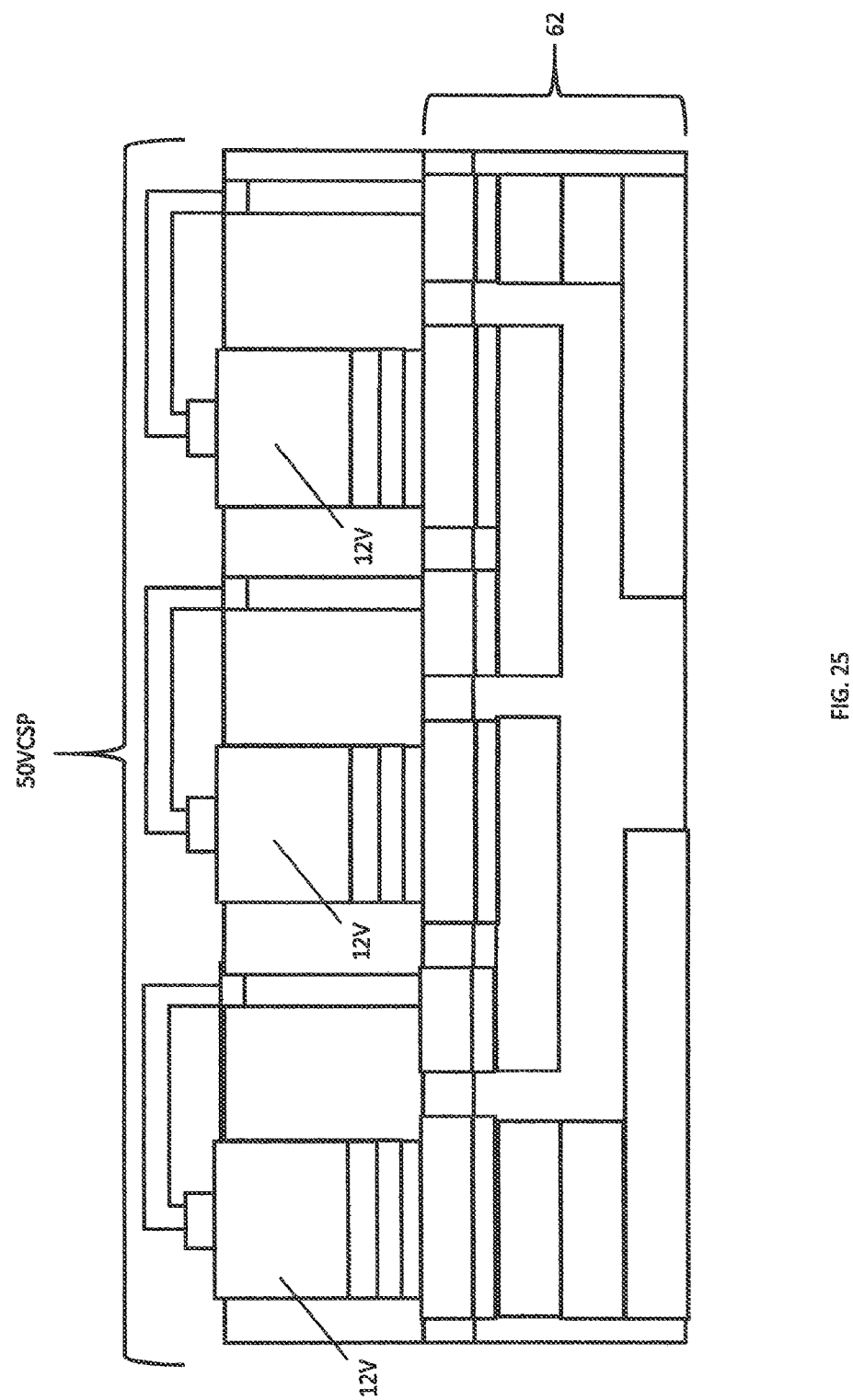
FIG. 25 is a schematic cross sectional view illustrating a vertical CSP LED array constructed using the method with three vertical CSPs.

As shown in FIG. 25, the method can be performed to form a vertical CSP array 50VCSP having vertical CSPs 12V interconnected via an electrical connector system 62 substantially as previously described.

As shown in FIG. 26, the method can be performed to form a LED array 5000B having flip chip CSPs 10FC interconnected via an electrical connector system 64 substantially as previously described. In addition, other passive components 30 such as application specific integrated circuit (ASIC), IC controller, IC Driver, zener diode can be mounted, bonded, connected to the LED array 50SYS. This forms circuitry 66 which is normally located on a separate LED driver PCB to form a display system, such as a LED chip on Board COB array. For this embodiment, a complete display LED array plus LED driver circuit and or controller are made using the method without employing a PCB or CCB.

As shown in FIGS. 27(*a*)-27(*c*), the method can be performed to form a simple red/green/blue RG) CSP array 50RGB that includes a red vertical CSP 10V-R, a green planar CSP 10H-R and a blue planar CSP 10H-B. FIG. 25(*b*) illustrates the backside of the RGB LED array 50RGB. FIG. 25(*c*) illustrates the RGB LED array 50RGB-E with extended pads 70 formed as previously described. The cathodes and anodes are labeled with an electrical connection made for each of the cathodes for a common cathode design. In FIG. 25(*c*) the extended pads 70 for the RGB LED array 50RGB-E have been shown on the final material layer. Shorting is prevented by protecting contacts and traces using an insulator, such as SiO2, silicone, epoxy, or other non-electrically conductive materials. This particular design is a four-layer array. In RGB LED array 50RGB-E, the fourth layer can be used to relocate and enlarge the extended pads 70 to make using the RGB LED array 50RGB-E simpler for the end users. As such, the extended pads 70 can be configured as a common cathode, a red anode, a green anode, and a blue anode.

Figure 28A:
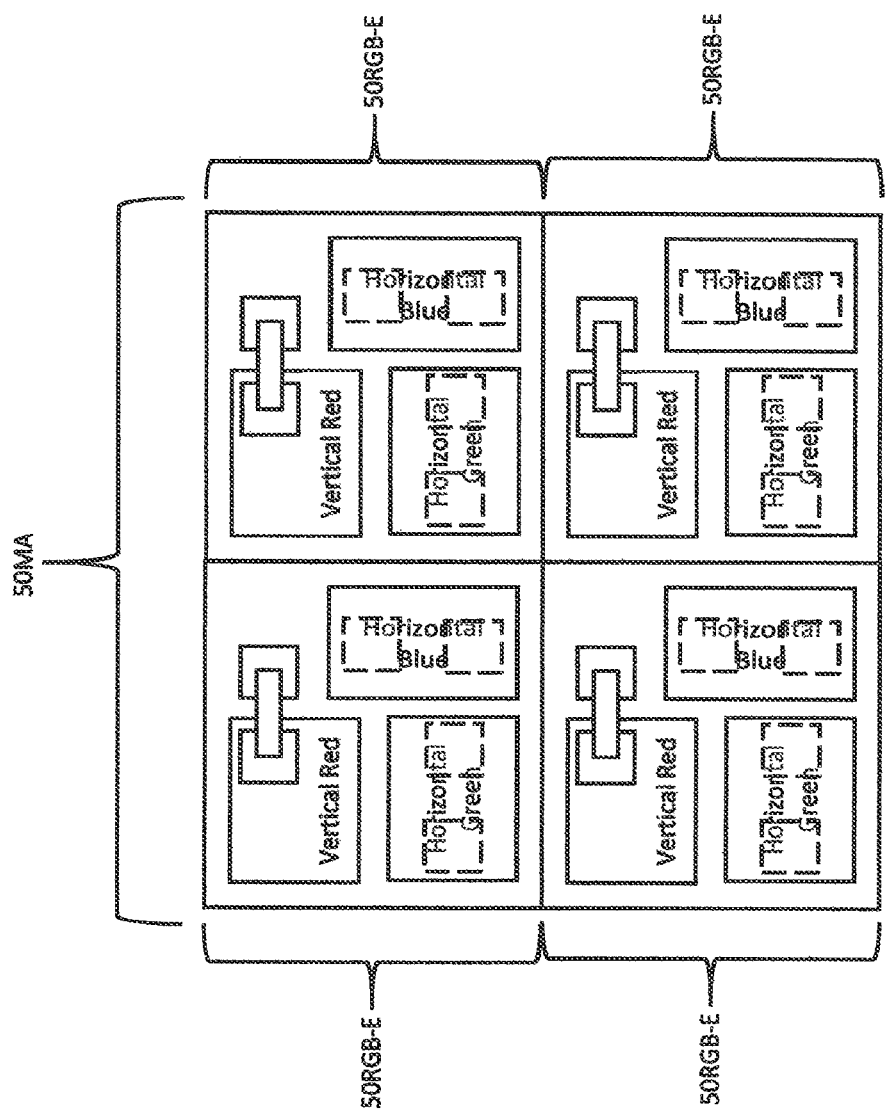
FIG. 28(a) is a schematic plan view of a multiple array RGB array constructed using the method.
Figure 28B:
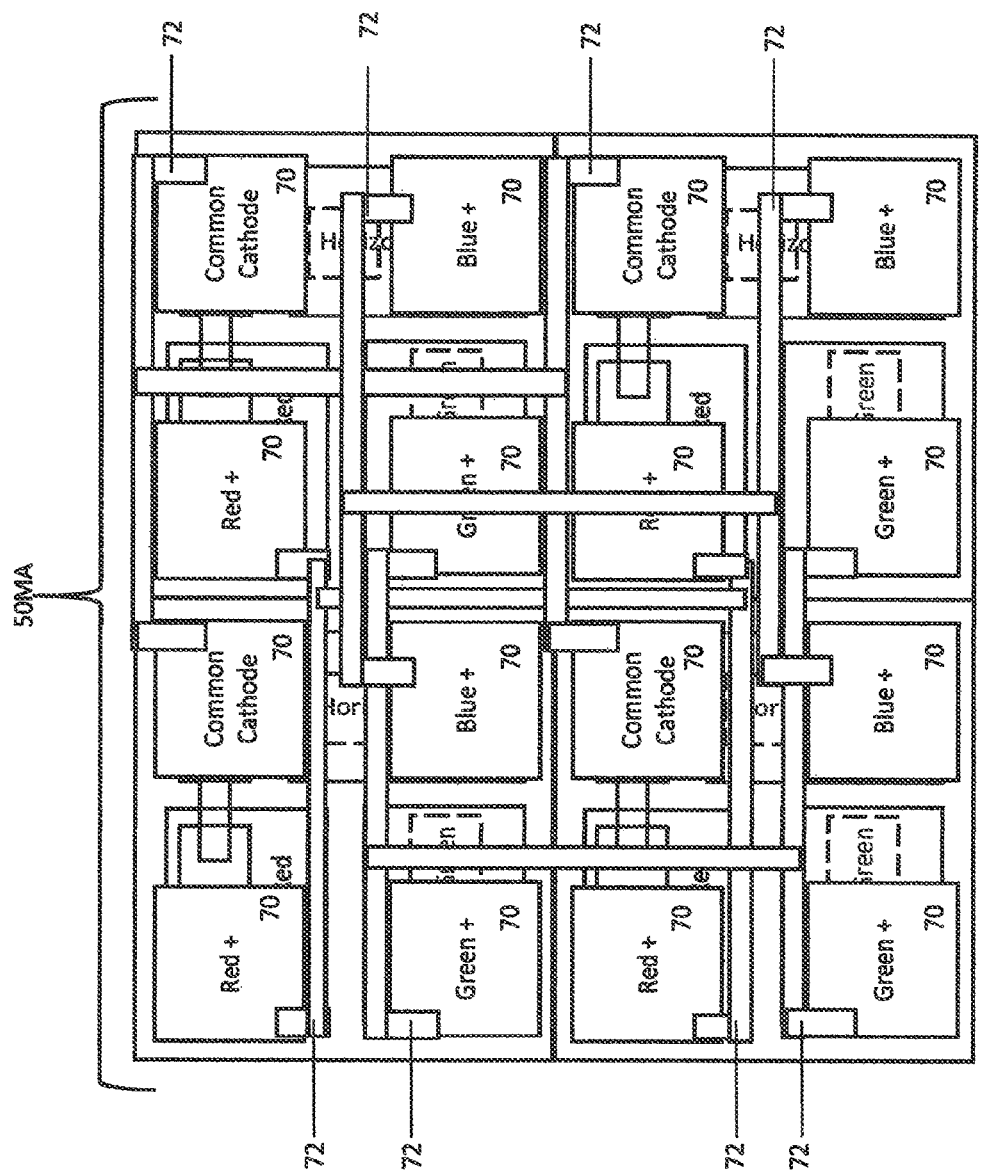
FIG. 28(b) is a schematic bottom view of the multiple array RGB array.
Figure 28C:
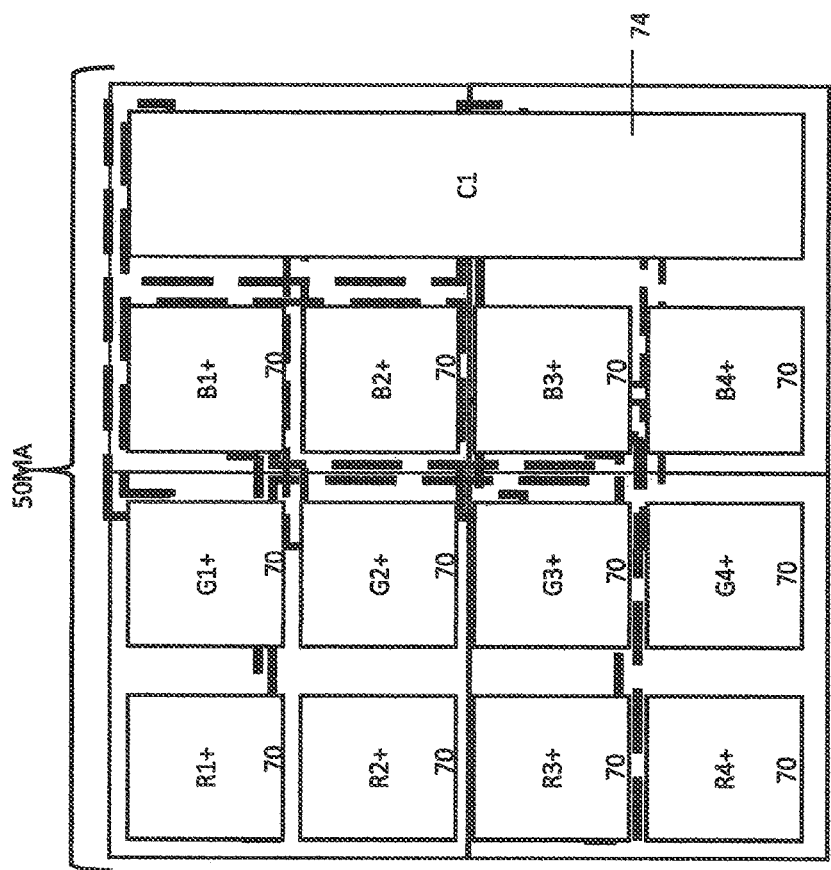
FIG. 28(c) is a schematic bottom view of the multiple array RGB array with a common cathode.

As shown in FIGS. 28(*a*)-28(*c*), the method can be performed to form a multiple array RGB array 50MA having four interconnected RGB LED arrays RGB-E with extended pads 70. As shown in FIG. 28(b), the extended pads (rather than the individual CSP packages) are interconnected using electrical connectors 72. As shown in FIG. 28(c), the multiple array (RGB) array 50MA can include a common cathode 74.

Figure 29A:
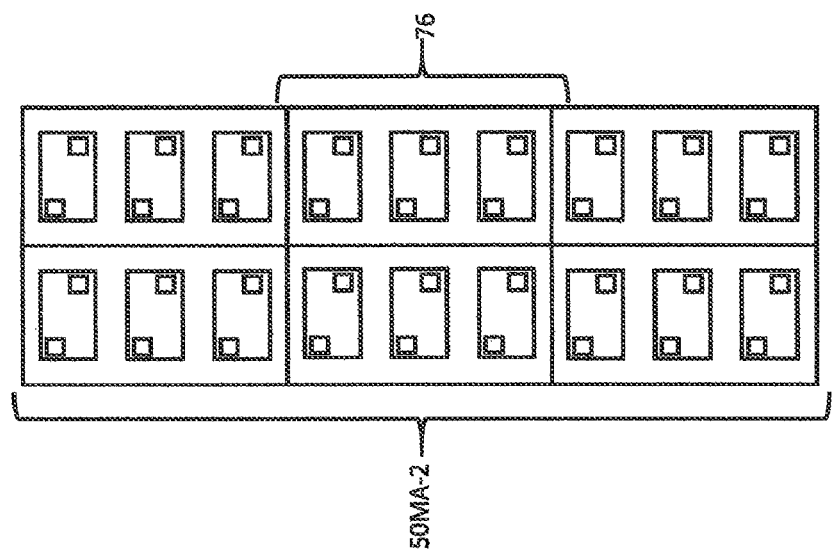
FIG. 29(a) is a schematic plan view of another multiple array RGB array constructed using the method.
Figure 29B:
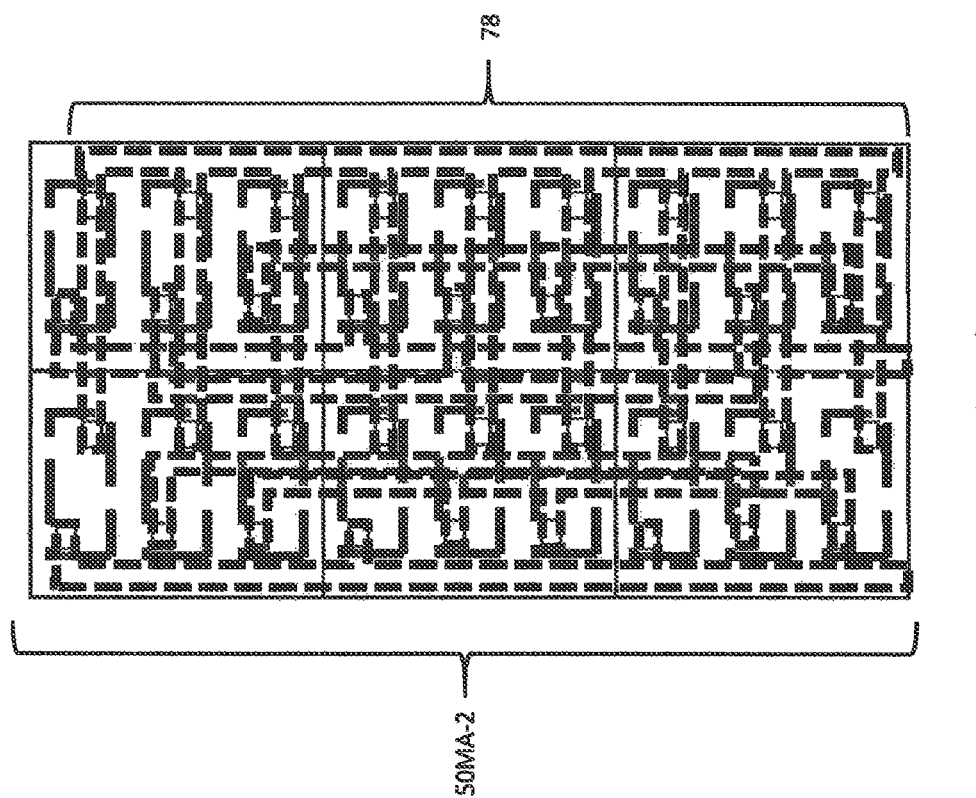
FIG. 29(b) is a schematic bottom view of the multiple array RGB array.

As shown in FIGS. 29(a)-29(c), the method can be performed to form another multiple array RGB array 50MA-2 having six interconnected arrays 76 connected using a connector system 78 (FIG. 29(b)) and having a common cathode 74 (FIG. 29(c)). The multiple LED arrays made using the method can be mounted/bonded/connected to a LED driver circuit PCB to make a large display While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

What is claimed is:

1. A method for making electronic device arrays comprising:
    providing a plurality of separate electronic devices;
    providing a carrier substrate and a temporary substrate attached to the carrier substrate, the carrier substrate configured as a support substrate for supporting the electronic devices and the temporary substrate configured as an attaching substrate for attaching the electronic devices to the support substrate;
    attaching the electronic devices to the temporary substrate;
    forming one or more insulator layers on the electronic devices while attached to the temporary substrate;
    forming one or more metal layers configured to electrically connect the electronic devices to form a desired circuitry; and
    separating the electronic devices along with the metal layers and the insulator layers from the carrier substrate and the temporary substrate.

2. The method of claim 1 wherein the electronic devices comprise bare dice, packaged dice, or optical devices having a desired configuration.

3. The method of claim 1 wherein the forming of the metal layers step and the forming of the insulator layers step are performed in stages such that each completed electronic device array has a structural integrity configured to support the electronic devices.

4. The method of claim 1 wherein each completed electronic device array has at least two metal layers and at least two insulator layers.

5. The method of claim 1 wherein each completed electronic device array includes one or more vias configured to electrically connect the metal layers.

6. A method for making electronic device arrays comprising:
    providing a plurality of separate electronic devices, each electronic device comprising a bare die, a packaged device or an optical device having a desired configuration;
    providing a carrier substrate and a temporary substrate attached to the carrier substrate, the carrier substrate configured as a support substrate for supporting the electronic devices and the temporary substrate configured as an attaching substrate for attaching the electronic devices to the support substrate, wherein the temporary substrate and the carrier substrate are combined into one substrate;
    attaching the electronic devices to the temporary substrate;
    forming one or more insulator layers on the electronic devices attached to the temporary substrate;
    forming one or more metal layers on the insulator layers configured to electrically connect the electronic devices to form a desired circuitry; and
    separating the electronic devices along with the metal layers and the insulator layers from the carrier substrate and the temporary substrate.

7. The method of claim 6 wherein the electronic devices are physically connected by the one or more insulator layers.

8. The method of claim 6 wherein the electronic devices comprise at least one vertical LED and at least one planar LED.

9. The method of claim 6 wherein the electronic devices comprise at least one planar LED.

10. The method of claim 6 further comprising prior to the separating step planarizing at least one insulator layer.

11. The method of claim 6 further comprising prior to the separating step planarizing at least one metal layer.

12. A method for making electronic device arrays comprising:
    providing a plurality of separate electronic devices, each electronic device having a desired configuration with extended pads;
    providing a carrier substrate and a temporary substrate attached to the carrier substrate, the carrier substrate configured as a support substrate for supporting the electronic devices and the temporary substrate configured as an attaching substrate for attaching the electronic devices to the support substrate;
    attaching the electronic devices to the temporary substrate;
    forming a plurality of metal posts on the temporary substrate in electrical contact with the electronic devices and encapsulating the metal posts in an insulator layer; and
    separating the electronic devices along with the metal posts and the insulator layer from the carrier substrate and the temporary substrate.

13. The method of claim 12 further comprising prior to the encapsulating the metal posts step, forming a plurality of electrical connectors in electrical contact with the metal posts and with pads on the electronic devices.

14. The method of claim 13 further comprising forming a common electrode in electrical communication with the electrical connectors.

15. The method of claim 14 wherein the common electrode comprises an anode or a cathode.

16. The method of claim 15 wherein the temporary substrate and the carrier substrate are combined into one substrate.

* * * * *

UNITED STATES PATENT AND TRADEMARK OFFICE
CERTIFICATE OF CORRECTION

PATENT NO. : 11,817,536 B2
APPLICATION NO. : 17/676334
DATED : November 14, 2023
INVENTOR(S) : David Trung Doan and Trung Tri Doan Page 1 of 1

It is certified that error appears in the above-identified patent and that said Letters Patent is hereby corrected as shown below:

On the Title Page

In item (63) Related U.S. Application Data:
"(63) Continuation of application No. 17/078,323, filed on Oct. 23, 2020, now Pat. No. 11,387,397, and a continuation of application No. 16/139,393, filed on Sep. 24, 2018, now Pat. No. 10,910,535."

Should be changed to:
--(63) Continuation of application No. 17/078,323, filed on Oct. 23, 2020, now Pat. No. 11,387,397, which is a continuation of application No. 16/139,393, filed on Sep. 24, 2018, now Pat. No. 10,910,535, which claims benefit of provisional application no. 62/583,018, filed on Nov. 8, 2017, and claims benefit of provisional application no. 62/590,715, filed on Nov. 27, 2017.--

Signed and Sealed this
Nineteenth Day of August, 2025

Coke Morgan Stewart
*Acting Director of the United States Patent and Trademark Office*